(12) United States Patent
Mavretic

(10) Patent No.: US 9,525,412 B2
(45) Date of Patent: Dec. 20, 2016

(54) SWITCHING CIRCUIT

(71) Applicant: Reno Technologies, Inc., Wilmington, DE (US)

(72) Inventor: Anton Mavretic, Natick, MA (US)

(73) Assignee: RENO TECHNOLOGIES, INC.

( * ) Notice: Subject to any disclaimer, the term of this patent is extended or adjusted under 35 U.S.C. 154(b) by 0 days.

(21) Appl. No.: 15/046,585

(22) Filed: Feb. 18, 2016

(65) Prior Publication Data

US 2016/0241234 A1    Aug. 18, 2016

Related U.S. Application Data

(63) Continuation-in-part of application No. 14/734,053, filed on Jun. 9, 2015, now Pat. No. 9,306,533.

(60) Provisional application No. 62/118,552, filed on Feb. 20, 2015, provisional application No. 62/117,728, filed on Feb. 18, 2015.

(51) Int. Cl.
| | |
|---|---|
| *H03H 7/38* | (2006.01) |
| *H03K 17/687* | (2006.01) |
| *G01R 19/165* | (2006.01) |
| *H03H 7/40* | (2006.01) |

(52) U.S. Cl.
CPC .......... *H03K 17/687* (2013.01); *G01R 19/165* (2013.01); *H03H 7/40* (2013.01)

(58) Field of Classification Search
CPC .................................. H03H 7/40; H03H 7/38
USPC ......................................... 333/17.3, 32, 262
See application file for complete search history.

(56) References Cited

U.S. PATENT DOCUMENTS

| | | |
|---|---|---|
| 3,828,281 A | 8/1974 | Chambers |
| 4,110,700 A | 8/1978 | Rosen et al. |
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |

(Continued)

FOREIGN PATENT DOCUMENTS

| | | |
|---|---|---|
| EP | 0840349 | 5/1998 |
| EP | 0840350 | 5/1998 |
| WO | 2006096589 | 9/2006 |

*Primary Examiner* — Stephen E Jones
(74) *Attorney, Agent, or Firm* — The Belles Group, P.C.

(57) ABSTRACT

In one embodiment, the invention can be a switching circuit, the switching circuit including a passive switch coupled to a first switch terminal; a driving switch coupled in series with the passive switch and a second switch terminal, the driving switch configured to turn the passive switch on and off; a power source configured to provide power to the passive switch and the driving switch; and a monitoring circuit configured to receive an indication that a switching circuit voltage exceeds a predetermined amount and, in response, reduce the power provided to the driving switch; or receive an indication that a switching circuit current exceeds a predetermined amount and, in response, reduce the power provided to the driving switch.

20 Claims, 16 Drawing Sheets

(56) References Cited

U.S. PATENT DOCUMENTS

| | | |
|---|---|---|
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | McKinzie, III |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | McKinzie, III |
| 8,217,732 B2 | 7/2012 | McKinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | McKinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | McKinzie, III |
| 8,559,907 B2 | 10/2013 | Burgener et al. |
| 8,564,381 B2 | 10/2013 | McKinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |
| 9,190,993 B1 | 11/2015 | Li |
| 2002/0060914 A1 | 5/2002 | Porter et al. |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |

(56) References Cited

U.S. PATENT DOCUMENTS

| | | |
|---|---|---|
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |

SWITCHING CIRCUIT

CROSS REFERENCE TO RELATED APPLICATIONS

The present application is a continuation in part of U.S. patent application Ser. No. 14/734,053, filed Jun. 9, 2015, which claims the benefit of U.S. Provisional Patent Application No. 62/118,552, filed Feb. 20, 2015. The present application further claims the benefit of U.S. Provisional Patent Application No. 62/117,728, filed on Feb. 18, 2015. The foregoing references are incorporated herein by reference in their entireties.

BACKGROUND

Semiconductor wafer fabrication can use plasma processing to manufacture semiconductor devices, such as microprocessors, memory chips, and other integrated circuits and devices. Plasma processing involves energizing a gas mixture by introducing RF energy. This gas mixture is typically contained in a vacuum chamber, also called plasma chamber, and the RF energy is introduced through electrodes or other means in the chamber. In a typical plasma process, the RF generator generates power at an RF frequency and this power is transmitted through RF cables to the plasma chamber.

To provide efficient transfer of power from the generator to the plasma chamber, a matching network is used. The purpose of the matching network is to transform the plasma impedance (usually a low value) to a value suitable for the RF generator. In many cases, particularly in wafer fabrication processes, the RF power is transmitted through 50 Ohm coaxial cables and the system impedance of the RF generators is also 50 Ohm. On the other hand, the impedance of the plasma, driven by the RF power, varies and this impedance must be transformed to non-reactive 50 Ohm (i.e., 50+j0) for maximum power transmission. RF matching networks perform this task of continuously transforming the plasma impedance to 50 Ohm for the RF generator. A typical RF matching network includes variable capacitors and a microprocessor-based control circuit to control the capacitance values of the variable capacitors. The value and size of the variable capacitors are influenced by the power handling capability, the frequency of operation, and the impedance range of the plasma chamber.

The predominant variable capacitor in use in RF matching networks is the Vacuum Variable Capacitor (VVC). Electronically Variable Capacitor (EVC) technology, however, is emerging as an alternative, as EVCs can be switched more quickly. Faster switching enables faster matching, which enables faster manufacturing.

High power applications, however, present additional challenges. In low power applications, the use of EVCs is more straightforward because a low voltage matching network can be used. When a matching network is used in a high power application, however, a high voltage matching network is required. In a high voltage matching network, the ability to quickly switch EVCs may be limited by the types of high voltage switches that are used to switch the EVCs themselves. Thus, there exists a need for a high voltage switch that can be used in conjunction with an EVC in an RF matching network for quick switching of high voltages (e.g., 2000 volts or more). Further, beyond semiconductor fabrication and matching networks, there exists a general need for an improved high voltage switch.

BRIEF SUMMARY

The present disclosure is directed to a switching circuit and methods, systems, and networks for same. In one aspect, a switching circuit includes a passive switch coupled to a first switch terminal; a driving switch coupled in series with the passive switch and a second switch terminal, the driving switch configured to turn the passive switch on and off; a power source configured to provide power to the passive switch and the driving switch; and a monitoring circuit configured to receive an indication that a switching circuit voltage exceeds a predetermined amount and, in response, reduce the power provided to the driving switch; or receive an indication that a switching circuit current exceeds a predetermined amount and, in response, reduce the power provided to the driving switch.

In another aspect, a method of controlling a switching circuit includes providing a switching circuit comprising a passive switch coupled to a first switch terminal; a driving switch coupled in series with the passive switch and a second switch terminal, the driving switch configured to turn the passive switch on and off; a power source configured to provide power to the passive switch and the driving switch; and a monitoring circuit; receiving at the monitoring circuit (a) an indication that a switching circuit voltage exceeds a predetermined amount or (b) an indication that a switching circuit current exceeds a predetermined amount; and reducing the power provided to the driving switch in response to the receipt of indication (a) or (b), the reduction of power switching off the switching circuit.

In yet another aspect, and RF impedance matching network includes an RF input configured to couple to an RF source, the RF source having a fixed RF source impedance; an RF output configured to couple to a load, the load having a variable load impedance; a first circuit comprising a first variable component providing a first variable capacitance or inductance; and a second circuit comprising a second variable component providing a second variable capacitance or inductance; wherein each of the first circuit and the second circuit comprise a plurality of switching circuits configured to provide the first variable capacitance or inductance and the second variable capacitance or inductance, respectively, each of the plurality of switching circuits comprising: a passive switch coupled to a first switch terminal; a driving switch coupled in series with the passive switch and a second switch terminal, the driving switch configured to turn the passive switch on and off; and a power source configured to provide power to the passive switch and the driving switch.

In yet another aspect, a method of manufacturing a semiconductor includes placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma determining a variable load impedance of the plasma chamber, with an impedance matching network coupled between the load and the RF source, wherein the RF source has a fixed RF source impedance, and the impedance matching network comprises an RF input configured to couple to an RF source; an RF output configured to couple to a load; a first circuit in parallel to the RF input, the first circuit comprising a first variable component providing a first variable capacitance or inductance; and a second circuit comprising a second variable component providing a second variable capacitance or inductance; and determining a first capacitance value for the first variable capacitance component and a second capacitance value for the second variable capacitance component for creating an impedance match at an RF input of the impedance matching network; and generating a control signal to cause the first variable capacitance component to provide the first capacitance value, or to cause the second variable capacitance component to provide the second capacitance value; wherein each of the first circuit and the second circuit comprise a plurality of switching circuits configured to provide the first variable capacitance or inductance and the second variable capacitance or inductance, respectively, each of the plurality of switching circuits comprising a passive switch coupled to a first switch terminal; a driving switch coupled in series with the passive switch and a second switch terminal, the driving switch configured to turn the passive switch on and off; and a power source configured to provide power to the passive switch and the driving switch.

In yet another aspect, a switching circuit includes a passive switch coupled to a first switch terminal; a driving switch coupled in series with the passive switch and a second switch terminal, the driving switch configured to turn the passive switch on and off; and a power source configured to provide power to the passive switch and the driving switch.

In yet another aspect, and RF impedance matching network includes an RF input configured to couple to an RF source, the RF source having a fixed RF source impedance; an RF output configured to couple to a load, the load having a variable load impedance; a transformation circuit coupled to the RF input and configured to provide a transformed impedance that is less than the fixed source impedance; a first shunt circuit in parallel to the RF input, the first shunt circuit comprising a first shunt variable component providing a first variable capacitance or inductance; and a first virtual ground coupled to the first shunt variable component and a ground; and a second shunt circuit in parallel to the RF input and, the second shunt circuit comprising a second shunt variable component providing a second variable capacitance or inductance; and a second virtual ground coupled to the second shunt variable component and the ground; wherein each of the first shunt circuit and the second shunt circuit comprise a plurality of switching circuits configured to provide the first variable capacitance or inductance and the second variable capacitance and inductance, respectively, each of the plurality of switching circuits comprising a passive switch coupled to a first switch terminal; a driving switch coupled in series with the passive switch and a second switch terminal, the driving switch configured to turn the passive switch on and off; and a power source configured to provide power to the passive switch and the driving switch.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION

Figure 1A:
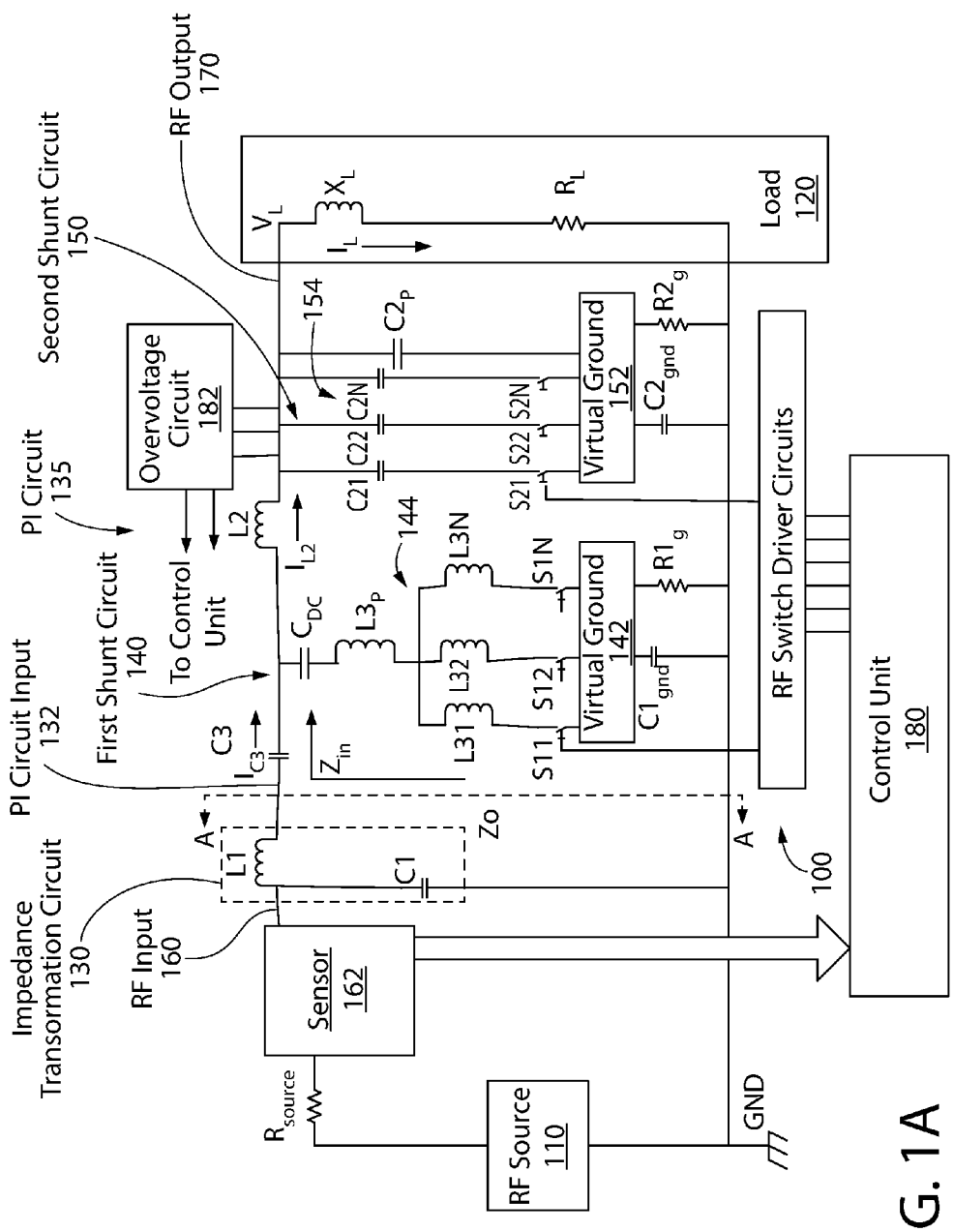
FIG. 1A is a schematic representation of a first embodiment of an RF impedance matching network.

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

In the embodiments of an RF impedance matching network disclosed herein, the matching network is configured as a "PI" type matching network. By this configuration, the switching of the variable capacitance components and variable inductance components (sometimes referred to collectively as variable components or reactive components) occurs in the shunt of the matching circuit. Thus, unlike in other matching networks, such as "L" type matching networks, the exemplified matching network switches its reactive components to a ground and not in series. There are no variable inductors or capacitors in the series leg.

In these embodiments, an RF impedance matching network includes an RF input configured to couple to an RF source, the RF source having a fixed RF source impedance; an RF output configured to couple to a load, the load having a variable load impedance; a transformation circuit coupled to the RF input and configured to provide a transformed impedance that is less than the fixed source impedance; and a PI circuit having a first shunt circuit in parallel to the RF input and a second shunt circuit in parallel to the RF input and the RF output. The first shunt circuit includes a first shunt variable component providing a first variable capacitance or inductance; and a first virtual ground coupled to the first shunt variable component and a ground. The second shunt circuit includes a second shunt variable component providing a second variable capacitance or inductance; and a second virtual ground coupled to the second shunt variable component and the ground.

In general, the circuit configurations are tailored to either an inductive or capacitive load impedance of the chamber. Whether one configures a shunt circuit as an inductor or a capacitor will depend on factors such as frequency of operation, power, and the appropriate physical size of the element. For example, smaller inductors will be easier to package and layout, with lower heat dissipation that is easier to control. Specific embodiments will be described in more detail below.

Turning in detail to the drawings, FIG. 1A illustrates an RF impedance matching network 100 according to a first embodiment of the invention. The matching network 100 includes an RF input 160 configured to couple to an RF source 110, and an RF output 170 coupled to a load 120. A sensor 162 is coupled at the RF input 160 between the RF source 110 and the matching network 100. In the exemplified embodiment, the load 120 is a plasma chamber for semiconductor device fabrication. The semiconductor device can be microprocessor, a memory chip, or another type of integrated circuit or device. In other embodiments, the load 120 can be any load of variable impedance that can utilize an RF matching network.

In the exemplified embodiment, the RF impedance matching network 100 serves to help maximize the amount of RF power transferred from the RF source 110 to the plasma chamber 120 by matching the impedance at the RF input 160 to the fixed impedance of the RF source 110. The matching network 100 can consist of a single module within a single housing designed for electrical connection to the RF source 110 and plasma chamber 120. In other embodiments, the components of the matching network 100 can be located in different housings, some components can be outside of the housing, and/or some components can share a housing with a component outside the matching network 100.

As is known in the art, the plasma within a plasma chamber 120 typically undergoes certain fluctuations outside of operational control so that the impedance presented by the plasma chamber 120 is a variable impedance. Since the variable impedance of the plasma chamber 120 cannot be fully controlled, an impedance matching network may be used to create an impedance match between the plasma chamber 120 and the RF source 110.

Moreover, the impedance of the RF source 110 may be fixed at a set value by the design of the particular RF source 110. Although the fixed impedance of an RF source 110 may undergo minor fluctuations during use, due to, for example, temperature or other environmental variations, the impedance of the RF source 110 is still considered a fixed impedance for purposes of impedance matching because the fluctuations do not significantly vary the fixed impedance from the originally set impedance value. Other types of RF sources may be designed so that the impedance of the RF source may be set at the time of, or during, use. The impedance of such types of RF sources is still considered fixed because it may be controlled by a user (or at least controlled by a programmable controller) and the set value of the impedance may be known at any time during operation, thus making the set value effectively a fixed impedance.

The RF source 110 may be an RF generator of a type that is well-known in the art to generate an RF signal at an appropriate frequency and power for the process performed within the plasma chamber 120. The RF source 110 may be electrically connected to the RF input 160 of the RF impedance matching network 100 using a coaxial cable or similar means, which for impedance matching purposes would have the same fixed impedance as the RF source 110.

The plasma chamber 120 can include a first electrode and a second electrode, and in processes that are well known in the art, the first and second electrodes, in conjunction with appropriate control systems (not shown) and the plasma in the plasma chamber 120, enable one or both of deposition of materials onto a substrate and etching of materials from the substrate.

The sensor 162 is configured to monitor the RF signal output from the RF source 110. The sensor 162 can monitor an RF input parameter or multiple RF input parameters at the RF input 160. The sensor 162 can be any sensor configured to detect a parameter at the RF input 160. The input parameter can be any parameter measurable at the RF input 160 sufficient for operating the matching network 100. In the exemplified embodiment, the sensor 162 detects the voltage, current, and phase at the RF input 160 of the matching network 100. The sensor 162 can provide analog information to a control unit 180, where it is converted to a digital form. Based on the RF input parameter detected by the RF input sensor 162, the control unit 180 can determine the variable load impedance. The control unit 180 can further calculate the necessary switching positions on the shunt legs such that the proper inductance and capacitance is provided by the variable components 144, 154 for creating an impedance match. That is, the control unit 180 can determine a first shunt capacitance value for the first shunt variable capacitance component 144 and a second shunt capacitance value for the second shunt variable capacitance component 154 to create an impedance match at the RF input 160. The control unit 180 can then send a control the driver circuit 185 to alter a first shunt variable capacitance of the first shunt variable capacitance component 144; and alter a second shunt variable capacitance of the second shunt variable capacitance component 154 based on a second control signal received from the control unit 180. The match need not be a perfect matching of impedance. For example, an impedance match can result in 10% or less RF power reflected back to the RF source.

Most of the inductive and capacitive components used in the discussed embodiments can be designed on a ceramic substrate or some other material such as Rogers material that can withstand the temperature excursions. Particularly at higher power levels and large currents a capacitive array or/and inductive array may be specifically packaged to satisfy the thermal issues associated with current passing through the shunt elements and series elements at higher power levels. Many of these components will be either air cooled or water cooled, depending on the particular architecture used for a specific load.

Transformation Circuit

The matching network 100 of the exemplified embodiment includes both a PI circuit 135 and a transformation circuit 130. The fixed impedance transformation circuit 130 is located at the front-end of the matching network 100. The transformation circuit 130 is coupled to the RF input 160 and enables the impedance at cross-section A-A looking back toward RF input 160 to be lowered to a value that is less than the real part of the fixed RF source impedance, thus providing a desired lowered impedance at the input of the PI circuit 135 (the PI circuit input 132) that is less than the fixed impedance of the RF source 110. In this embodiment, the RF source impedance is fixed at 50 Ohms, and RF power is transmitted through coaxial cables which also have a fixed impedance of 50 Ohms. In other embodiments, the fixed impedance can be of a different value. In preferred embodiments, the lowered impedance is less than the real part of the load impedance ($R_L$).

The transformation circuit 130 includes an inductor L1 (sometimes referred to as a transformation inductor) and a capacitor C1 (sometimes referred to as a transformation capacitor). In this embodiment, the transformation inductor L1 is in series with the RF input 160, and the transformation capacitor C1 is in parallel to the RF input 160 and coupled to a chassis ground GND. In other embodiments, the configuration is reversed, with the capacitor in series with the RF input 160, and the inductor in parallel to the RF input 160 and coupled to the chassis ground GND. The configuration chosen depends on the remaining PI circuit 135 and the configuration that prevents the DC component of the load 120 returning to the RF source 110. The transformation circuit 130 is connected to a chassis ground GND (not the virtual grounds, which will be discussed below). In other embodiments, the chassis ground GND can be another type of ground.

In the exemplified embodiment, the transformation circuit 130 is configured to lower the impedance from 50 Ohms at the RF input 160 to approximately 15 Ohms at the PI circuit input 132 (the input of the PI circuit 135), with no imaginary part (or minimal imaginary part). Thus, for example, the output impedance ($Z_o$) of the transformation circuit 130 is approximately 15 Ohms+j0. The PI circuit 135 of the matching network 100 is designed for this reduced input impedance, referred to as $Z_{in}$ FIGS. 1A-10. The interface between the output of the transformation circuit 130 and the PI circuit 135 is designated by line A-A.

The transformation circuit 130 can lower the voltage stresses on the matching network 100. Thus, high voltage stress on switches S11 to S1N and S21 to S2N will be lowered. Such lowered stress enhances the functioning of switches such as RF FET switches, PIN diodes, and insulated-gate bipolar transistors (IGBTs).

This lowered stress can be better understood by the following examples. In the first example, there is no transformation circuit. A 5,000 Watts RF generator (RF source) has a 50 Ohms output impedance ($R_{source}$) and a frequency of 27.12 MHz that is provided at the RF input 160 of the matching network 100. The matching network 100 is perfectly tuned to 50 Ohms at its input and has no reactive components present. The voltage ($V=\sqrt{PR}$) therefore will be $\sqrt{(5000W)(50Ohms)}$ or 500 V rms. The current (I=V/R) will be 500 V rms/50 Ohms, or 10 A rms.

In the second example, a transformation circuit lowers the impedance provided at the input 132 of the PI circuit 135 to 15 Ohms. The voltage ($V=\sqrt{PR}$) will now be $\sqrt{(5000W)(15Ohms)}$ or 273.9 V rms, and the current (I=V/R) will be 273.9 V rms/15 Ohms, or 18.3 A rms. Thus, the current increases by a factor of 1.83, while the voltage decreases by a factor of 1.83. The active components of the PI circuit 135 more easily handle current than voltage. Thus, the transformation circuit's reduction of voltage causes less stress on the active components. A designer can choose for his convenience appropriate impedance reduction factor. That reduction factor depends on chamber load impedance and its real part ($Z_L=R_L+/-jX_L$). In preferred embodiments, the reduced input impedance $Z_{in}$ is less than the real part of the load impedance ($R_L$).

PI Circuit

The PI circuit 135 of FIG. 1A includes a series capacitor C3 in series with the RF input 160 and coupled between the transformation inductor L1 and the RF output 170. The series capacitor C3 can decouple the DC component to help prevent the DC component of the load 120 from returning to the RF source 110. The PI circuit 135 further includes a series inductor L2 in series with the RF input 160 and coupled between the series capacitor C3 and the RF output 170. The PI circuit 135 further includes a first shunt circuit 140 in parallel to the RF input 160 and a second shunt circuit 150 parallel to the RF input 160.

The first shunt circuit 140 includes a first shunt capacitor $C_{DC}$ and a first shunt padding inductor $L3_P$. The first shunt capacitor $C_{DC}$ can decouple the DC component of the plasma coming back toward the switches S11, S12, S1N, such that the switches are not burdened with large components of the DC voltage. The first shunt circuit 140 further includes a first shunt variable inductive component 144 comprising (a) a plurality of first shunt inductors L31, L32, L32 coupled in parallel to the first shunt padding inductor $L3_P$, and (b) a plurality of first shunt switches S11, S12, S1N coupled to the plurality of first shunt inductors L31, L32, L32 and configured to connect and disconnect each of the plurality of first shunt inductors L31, L32, L32 to a first virtual ground 142. Also included is a first shunt ground capacitor $C1_{gnd}$ coupled between the second virtual ground and the ground GND. The first shunt ground capacitor $C1_{gnd}$ and a first shunt ground inductance inherent to the first virtual ground 142 can resonate in series to provide the lowest possible impedance from the virtual ground to the ground GND. The first shunt circuit 140 further includes a first shunt galvanic return resistor $R1_G$ coupled between the first virtual ground 142 and the ground GND. The first shunt ground capacitor $C1_{gnd}$ and the first shunt galvanic return resistor $R1_G$ are coupled in parallel.

The second shunt circuit 150 includes a second shunt variable capacitance component 154 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 152. The circuit further includes a padding capacitor $C2_P$ coupled in parallel to at least one of the plurality of second shunt capacitors C21, C22, C2N, the padding capacitor $C2_P$ coupled to the second virtual ground 152. The circuit further includes a second shunt ground capacitor $C2_{gnd}$ coupled between the second virtual ground 152 and the ground GND, and a second shunt galvanic return resistor $R2_G$ coupled between the second virtual ground 152 and the ground GND. The second shunt ground capacitor $C2_{gnd}$ and the first shunt galvanic return resistor $R2_G$ are coupled in parallel. The capacitors, inductors, and resistors discussed herein can refer to any components of suitable design to provide capacitance, inductance, and resistance, respectively. In preferred embodiments, the matching network is designed such that, for a particular load, there is minimal possible variation of capacitors and inductors, thereby allowing the fewest possible switches.

Padding capacitors and padding inductors are capacitors and inductors that do not need to be switched.

The variable inductance components discussed herein can refer to a plurality of shunt inductors and coupled switches, and is sometimes referred to as an inductive array or simply a variable inductor. Similarly, the variable capacitance components discussed herein can refer to a plurality of shunt capacitors and coupled switches, and is sometimes referred to as a capacitive array or simply as a variable capacitor. A variable inductance component can refer to any structure capable of providing a variable inductance, and a variable capacitance component can refer to any structure capable of providing a variable capacitance. For example, the variable capacitance component can be an electronic variable capacitor (EVC), as described in U.S. Pat. No. 7,251,121. By these components, the capacitances and inductances provided in the shunt legs can be controlled such that the combined impedances of the RF impedance matching network 100 and the plasma chamber match, or at least substantially match, the fixed impedance of the RF source 110. A first shunt variable inductance component 144 and a second shunt variable capacitance component 154 are shown in FIG. 1A.

Virtual Ground

Figure 1B:
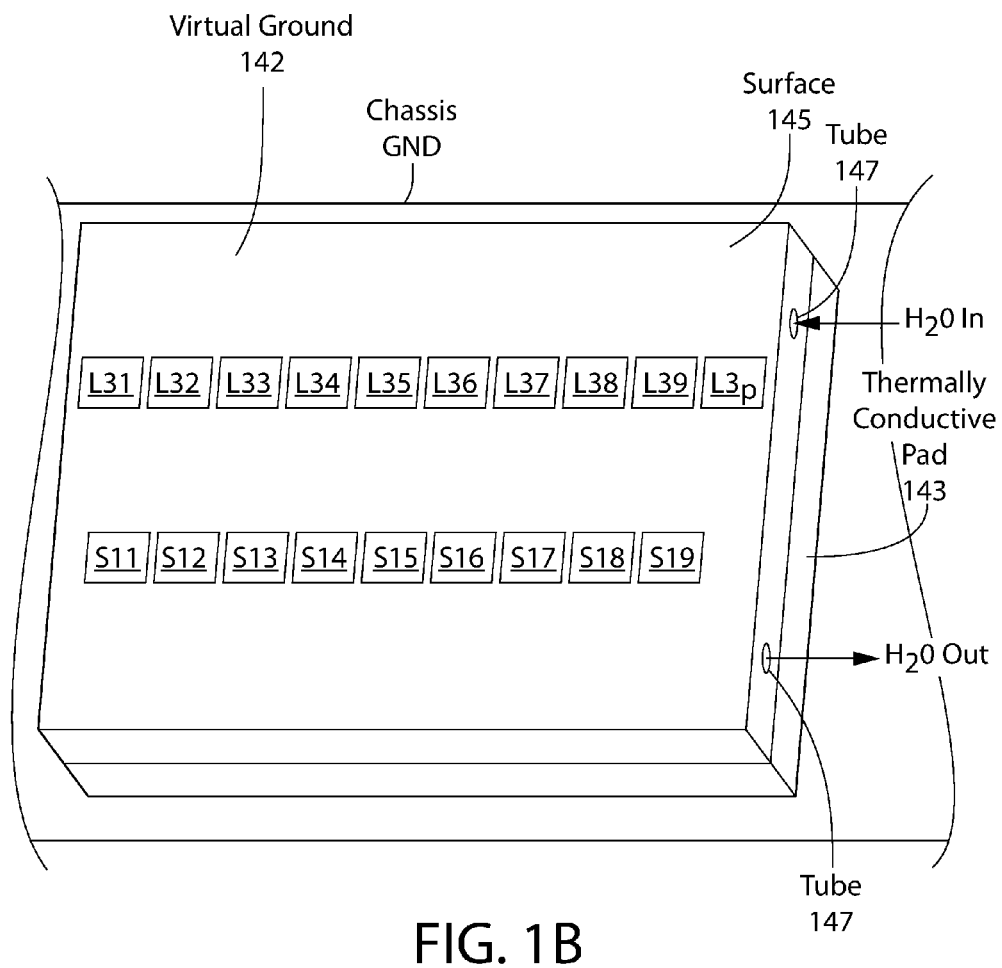
FIG. 1B is a representation of a first embodiment of a virtual ground.

As discussed above, the switches are not connected directly to chassis ground GND but to a virtual ground 142, 152. FIG. 1B shows an embodiment of the first virtual ground 142. The same or a similar structure can be used for virtual ground 152 and the other virtual grounds disclosed herein. In the exemplified embodiment of FIG. 1B, the virtual ground 142 is an aluminum plate with embedded tubes 147. The virtual ground 142 is water cooled, with water ($H_2O$) flowing in and out of the embedded tubes 147. The virtual ground can include thermally conductive isolation pads or paste between the virtual ground surface 145 and the chassis GND to conduct heat and to separate the virtual ground from the chassis ground GND. The pad 143 is not electrically conductive. In other embodiments, the virtual ground 142, 152 can be any electrically conductive component that is physically separated from a ground. For example, the virtual ground can be arranged vertically or include fins. Further, the virtual ground can include other cooling means. For example, at low power applications, the virtual ground can be air cooled. Standard heat sinking methods can be applied.

In the exemplified embodiment of FIG. 1B, nine switches S11-S19 are mounted on the surface 145 of the virtual ground 142. The nine switches S11-S19 correspond with switches S11, S12, and S1N of FIG. 1A, since the "N" can refer to any total number of switches (or any total number of inductors or capacitors as "N" is used elsewhere in the drawings). In other embodiments, more or less switches can be used, depending on the required accuracy of the variable inductance (or variable capacitance in other embodiments).

Switchable and padding components L31-L39 and L3$_P$ (corresponding to L31, L32, L3N, L3$_P$ of FIG. 1A) can also be mounted on the surface 145 of the first virtual ground 142, as shown in FIG. 1B. The exemplified embodiment uses nine switchable inductors, though, as with the switches discussed above, any number of switchable inductors (or switchable capacitors depending on the embodiment) can be used. Further, the other virtual grounds disclosed herein can be configured similarly. Thus, the switchable and padding components C21, C22, C2N, C2$_P$ of the second shunt circuit 150 can be mounted on a surface of the second virtual ground 152 in a manner similar to the surface 145 of virtual ground 142 shown in FIG. 1B. Further, similar virtual grounds can be used for the matching network embodiments shown in FIGS. 2-10. For example, virtual ground 242 of FIG. 2 can use a virtual ground configuration similar to that shown in FIG. 1B, but where capacitors C11, C12, C1N, C1$_P$ are mounted on the surface of the virtual ground 242 instead of inductors L31-L39 and L3$_P$.

As shown in FIG. 1A, the virtual ground 142, 152 can be connected to a common RF chassis ground GND via a ground capacitor C1$_{gnd}$, C2$_{gnd}$. The virtual ground 142, 152 has an inherent inductance ($L_{gnd}$) that is generally small. This inherent inductance can connect in series with the ground capacitor to create a series resonant circuit. The series resonant circuit acts as a short at the frequency of operation. There is also a galvanic return resistor designated as R1$_G$ or R2$_G$ that has a much larger value than the series resonance impedance of $L_{gnd}$ and $C_{gnd}$. Thus, the galvanic connection does not pass the main RF current.

By using a virtual ground for each shunt circuit of variable components, each branch return of RF-switched current can go to one point ground. Since the shunt branch RF current can be very large, they will be much easier to control and to stream them away from, for example, FET gate driving low voltage circuitry. Further, noise immunity and RF interference within the matching network will be much easier to control.

By the virtual ground, the switches in a shunt circuit can be connected to a platform from which heat can be better controlled and extracted if needed. The RF currents flowing from the tuning capacitors or inductors (e.g., L31, S21) will always flow into the virtual ground 142. The virtual ground 142 can also reduce the coupling capacitance from the back side of the switches and their respective FETs to a ground. Each variable capacitive or inductive component 144, 154 can have a separate virtual ground 142, 152 to further reduce the capacitive cross talk among the switches. The separation of switched currents in the virtual ground can help reduce the jitter noise in the switches as well as cross talk among the switches. These currents can be very difficult to control at very high RF power levels. The virtual ground can ease the design of high power switches.

After full layout of the circuit, one can determine the inductance of the ground connections. A capacitance can be determined for some very small impedance from virtual ground to the chassis ground GND by calculating the needed capacitance $C_{gnd}$. In a preferred embodiment, the capacitor $C_{gnd}$ has a very low ESR (equivalent series resistance) and should withstand several kilovolts of voltage breakdown in case of overvoltage occurrence on the RF switches. Choosing the proper components can prevent the network from being under high voltage stress. The embodiment shown in FIG. 1A is useful for an inductive load chamber and powers below 5 kW.

In the matching network 100 of FIG. 1A and certain other embodiments discussed hereafter, a bypass capacitor $C_{DC}$ (or C4) forms part of the shunt circuit 140 for the purpose of decoupling the DC voltage that may be reflected from the chamber load 120. This capacitance is not part of the matching network 100 in that this capacitance is not used for matching purposes. The capacitor $C_{DC}$ can sustain high voltage swings coming back from the load 120 and can pass very large RF currents. For instance, at RF power P=5 kW, these currents may be in the order of 100 A rms. The bypass capacitor $C_{DC}$ can be in series with the variable shunt inductance and can prevent the DC voltage returning from the chamber 120 from reaching the RF switches.

In the exemplified embodiment, the switches use field effect transistors (FETs). In other embodiments, the switches use PIN/NIP diodes, a Micro Electro Mechanical (MEM)

switch, a solid state relay, bipolar transistors, insulated-gate bipolar transistors (IGBTs), and the like. In the exemplified embodiment, each switch turns a capacitor or inductor ON or OFF to control the overall capacitance or inductance provided by the variable components 144, 154, thus enabling the matching network 100 to provide variable capacitance and variable inductance in the shunt legs. In alternative embodiments, a switch can be configured to control more than one capacitor or inductor.

The matching network 100 includes one or more RF switch driver circuits 185. The driver circuits 185 are configured to switch the plurality of switches S11, S12, S1N, S21, S22, S2N. Each of the driver circuits 185 can include several discrete driving circuits, with each discrete driving circuit configured to switch one of the switches.

The matching network 100 further includes a control unit 180. The control unit 180 is the brains of the RF impedance matching network 100 as it receives multiple inputs from sources such as the sensor 162 and the driver circuits 185 and makes calculations necessary to determine changes to the variable capacitance and inductance components 144, 154, and delivers commands to these components 144, 154 to create the impedance match. The control unit 180 can be of the type that is commonly used in semiconductor fabrication processes, and therefore known to those of skill in the art.

The control unit 180 can be configured with an appropriate processor and/or signal generating circuitry to provide an input signal for controlling the driver circuits 185. The control unit 180 of the matching network 100 can be a standard DSP- and FPGA-based architecture. The control unit 180 can house several other circuits, including an overvoltage conditioning circuit 182 for switching off all the active switches in the case of overvoltage at the output of the match. The overvoltage circuit 182 can indicate to the control board when to go into the shutdown condition.

In the exemplified embodiment, the control unit 180 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network 100 to perform the functions described herein.

A power supply (not shown) can be connected to the driver circuits 185, control unit 180, and sensor 162 to provide operational power, at the designed currents and voltages, to each of these components.

The inductive and capacitive shunt designs in the PI configuration enable low voltage stresses on the variable components. High voltage stress is particularly hard on active FET switches that must switch large potentials as well as large currents at the power levels on the order of 5 kW. Since the disclosed embodiments do not switch any series components in these PI configurations, they are fixed in this matching network 100, and therefore there are lower voltages on the shunt capacitive or inductive components. This will be shown later in a tabular form.

At lower frequencies the inductors may be discrete since they will have inherently larger values. At higher frequencies such as 13.56 MHz, 27.12 MHz, 40.68 MHz, and 60 MHz, the inductors can be made by a method called spiral inductors and printed on a ceramic substrate.

Figure 2:
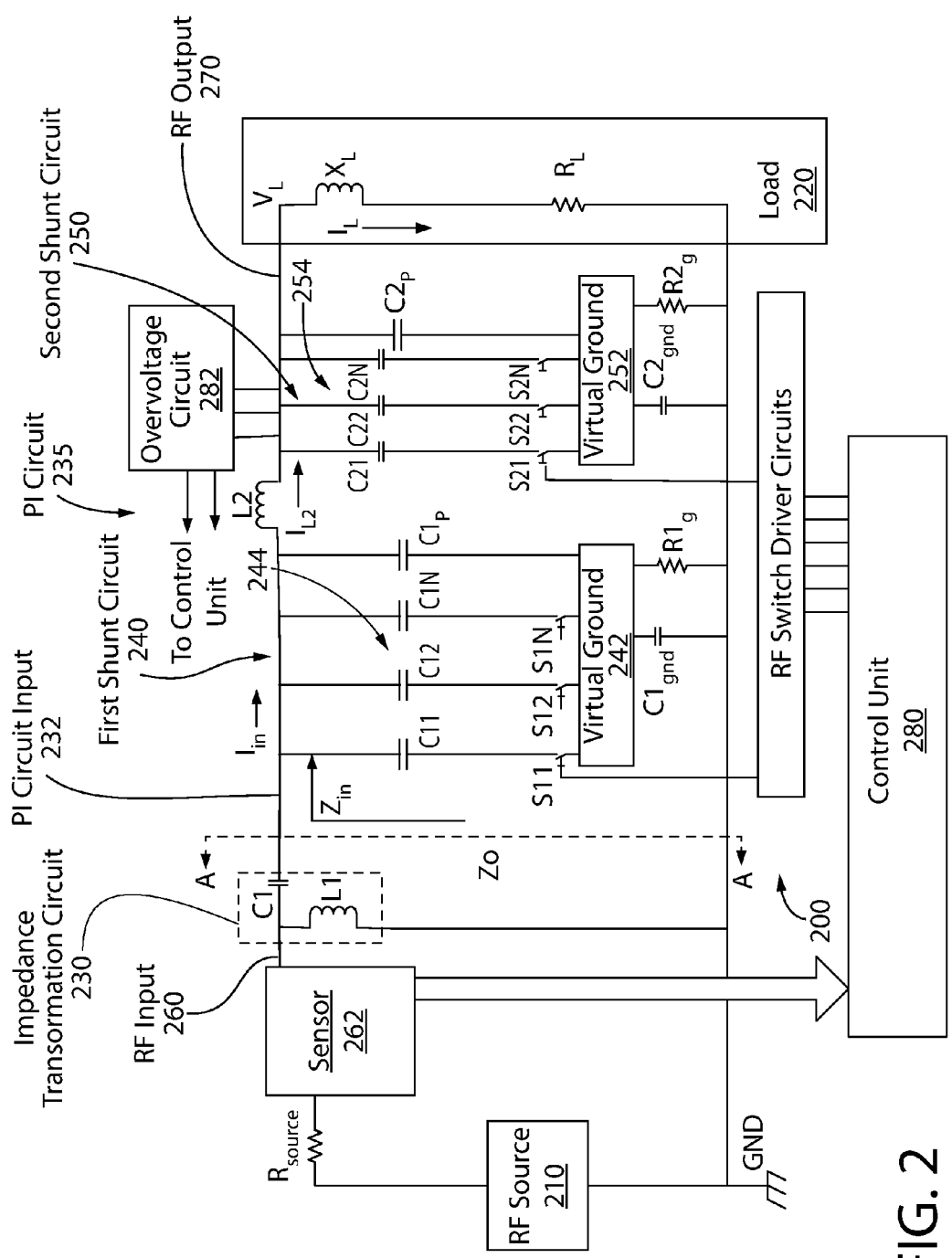
FIG. 2 is a schematic representation of a second embodiment of an RF impedance matching network.

FIG. 2 is a schematic representation of a second embodiment of an RF impedance matching network 200. As will be described, this embodiment uses variable capacitance components 244, 254 in both shunt legs. As in FIG. 1A, the matching network 200 includes an RF input 260 configured to couple to an RF source 210 and an RF output 170 configured to couple to a load 220, a transformation circuit 230, and a PI circuit 235.

The transformation circuit 230 is again coupled to the RF input 260 and configured to provide a transformed impedance that is less than the fixed source impedance. The transformation capacitor C1, however, is in series with the RF input 260, and the transformation inductor L1 is in parallel to the RF input and coupled to the chassis ground GND.

The first shunt circuit 240 is in parallel to the RF input 260. The circuit 240 includes a first shunt variable capacitance component 244 comprising (a) a plurality of first shunt capacitors C11, C12, C1N coupled in parallel, and (b) a plurality of first shunt switches S11, S1, S13 coupled to the plurality of first shunt capacitors C11, C12, C1N and configured to connect and disconnect each of the plurality of first shunt capacitors C11, C12, C1N to a first virtual ground 242. The first shunt circuit 240 further includes a padding capacitor $C1_P$ ("first shunt padding capacitor") coupled in parallel to at least one of the plurality of first shunt capacitors C11, C12, C1N, the first shunt padding capacitor $C1_P$ coupled to the first virtual ground 242; a capacitor $C1_{gnd}$ ("first shunt ground capacitor") coupled between the first virtual ground 242 and the ground GND; and a resistor $R1_G$ ("first shunt galvanic return resistor") coupled between the first virtual ground 242 and the ground GND.

The second shunt circuit 250 is also in parallel to the RF input 260. Similar to the first shunt circuit 240, the second shunt circuit 250 includes a second shunt variable capacitance component 254 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 252. The second shunt circuit 250 further includes a padding capacitor $C2_P$ ("second shunt padding capacitor") coupled in parallel to at least one of the plurality of second shunt capacitors C21, C22, C2N, the second shunt padding capacitor $C2_P$ coupled to the second virtual ground 252; a capacitor $C2_{gnd}$ ("second shunt ground capacitor") coupled between the second virtual ground 252 and the ground GND; and a resistor $R2_G$ ("second shunt galvanic return resistor") coupled between the second virtual ground 252 and the ground GND.

The matching network 200 further includes a series inductor L2 in series with the RF input 260 and coupled between the transformation capacitor C1 and the RF output 270. The embodiment of the matching network 200 shown in FIG. 2 is useful for inductive and capacitive loads. Since it has only one inductor in the series leg, it is efficient. It is useful for high power applications that are less than 10 kW.

Figure 3:
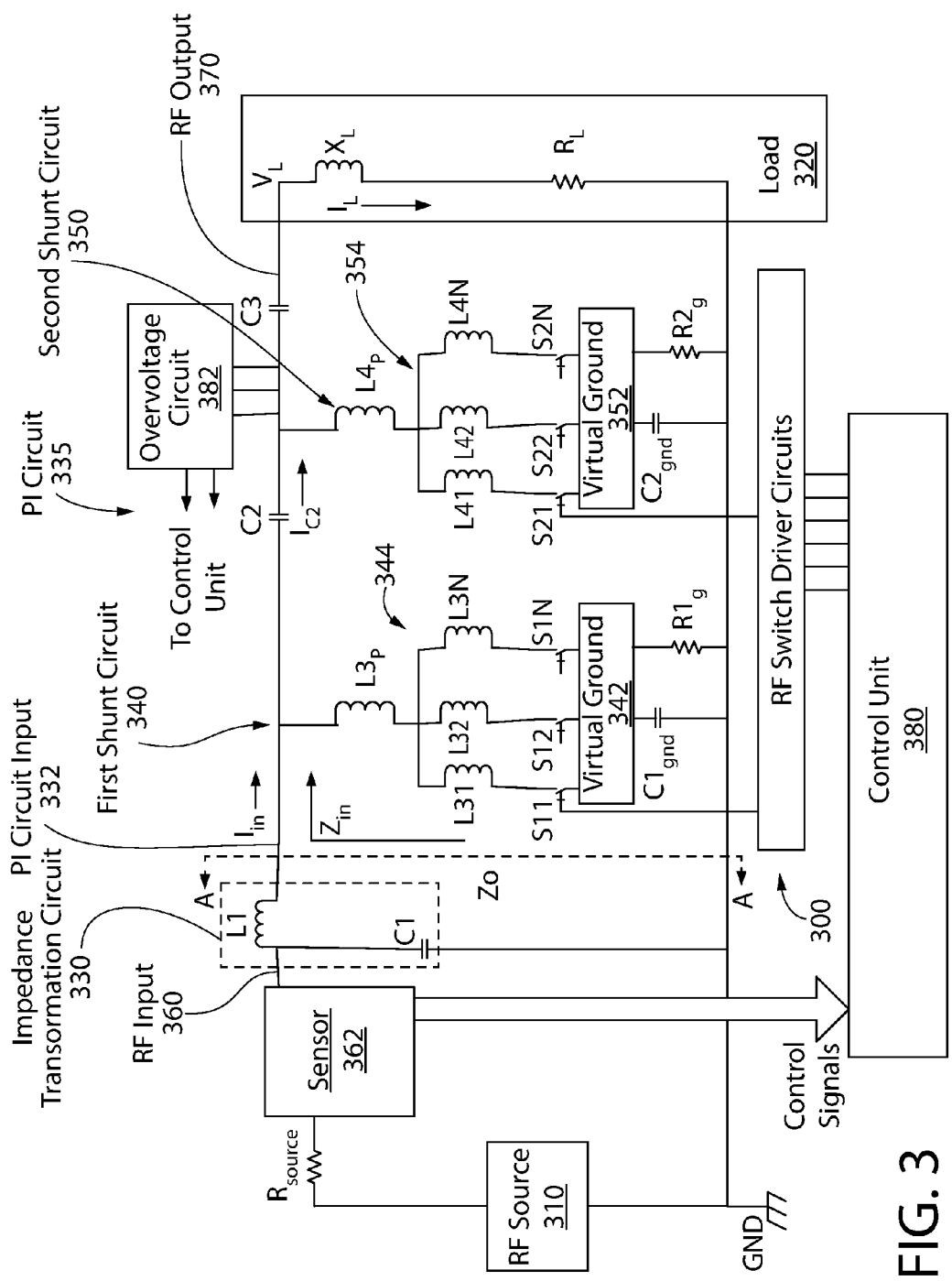
FIG. 3 is a schematic representation of a third embodiment of an RF impedance matching network.

FIG. 3 is a schematic representation of a third embodiment of an RF impedance matching network 300. In this embodiment, variable inductors 344, 354 are used in both shunt legs. As in the previous figures, the matching network 300 includes an RF input 360 configured to couple to an RF source 310 and an RF output 370 configured to couple to a load 320, a transformation circuit 330, and a PI circuit 335.

Similar to the embodiment shown in FIG. 1A, the transformation inductor L1 is in series with the RF input 360, and the transformation capacitor C1 is in parallel to the RF input 360 and coupled to a chassis ground GND. Also similar to FIG. 1A, the first shunt circuit 340 includes a first shunt padding inductor L3$_P$; a plurality of first shunt inductors L31, L32, L3N coupled in parallel to the first shunt padding inductor L3$_P$; a plurality of first shunt switches S11, S12, S1N coupled to the plurality of first shunt inductors L31, L32, L3N and configured to connect and disconnect each of the plurality of first shunt inductors L31, L32, L3N to a first virtual ground 342; a first shunt ground capacitor C1$_{gnd}$ coupled between the second virtual ground 352 and the ground GND; and a first shunt galvanic return resistor R1$_G$ coupled between the first virtual ground 342 and the ground GND. The second shunt circuit 350 is configured similar to the first shunt circuit 340. The matching network 300 further includes a first series capacitor and a second series capacitor coupled in series between the RF input 360 and the RF output 370.

The embodiment of the matching network 300 shown in FIG. 3 has only one inductor in the series leg and therefore is more efficient. It is useful for high power applications up to more than 5 kW. It is useful for inductive loads.

Figure 4:
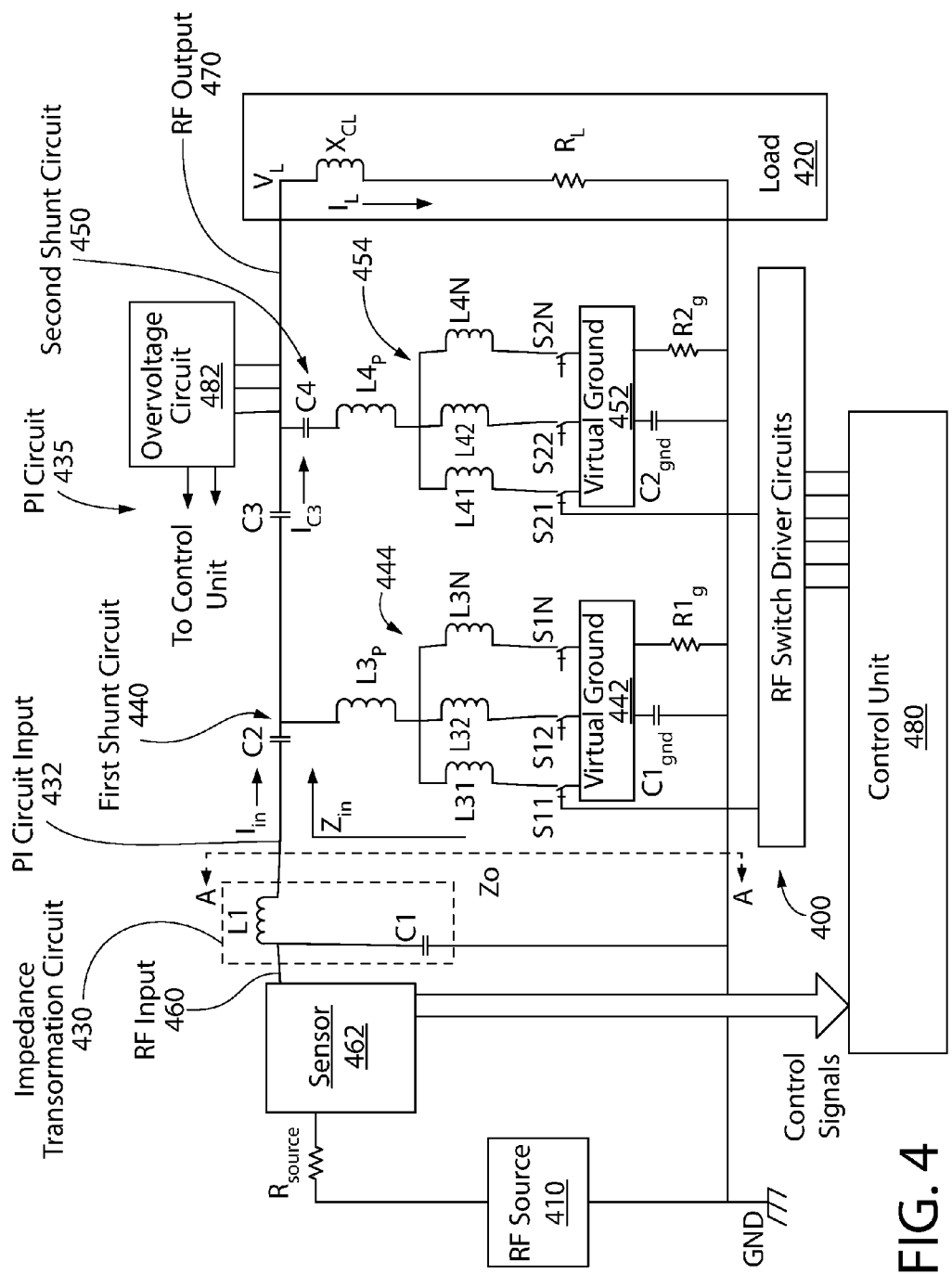
FIG. 4 is a schematic representation of a fourth embodiment of an RF impedance matching network.

FIG. 4 is a schematic representation of a fourth embodiment of an RF impedance matching network 400. This embodiment is similar to the embodiment shown in FIG. 3, however, the first series capacitor C2 is coupled between the RF input 460 and the first shunt circuit 440, the second series capacitor C3 is coupled between the first shunt circuit 440 and the second shunt circuit 450, and a single capacitor C4 is coupled in series with the padding inductor L4$_P$ in the second shunt circuit 450. The embodiment of the matching network 400 shown in FIG. 4 has only one inductor in the series leg and therefore is useful in higher power matching designs, up to approximately 10 kW. The series capacitor C3 is moved away from high current in the load loop, which improves efficiency and therefore usefulness for high RF power matching.

Figure 5:
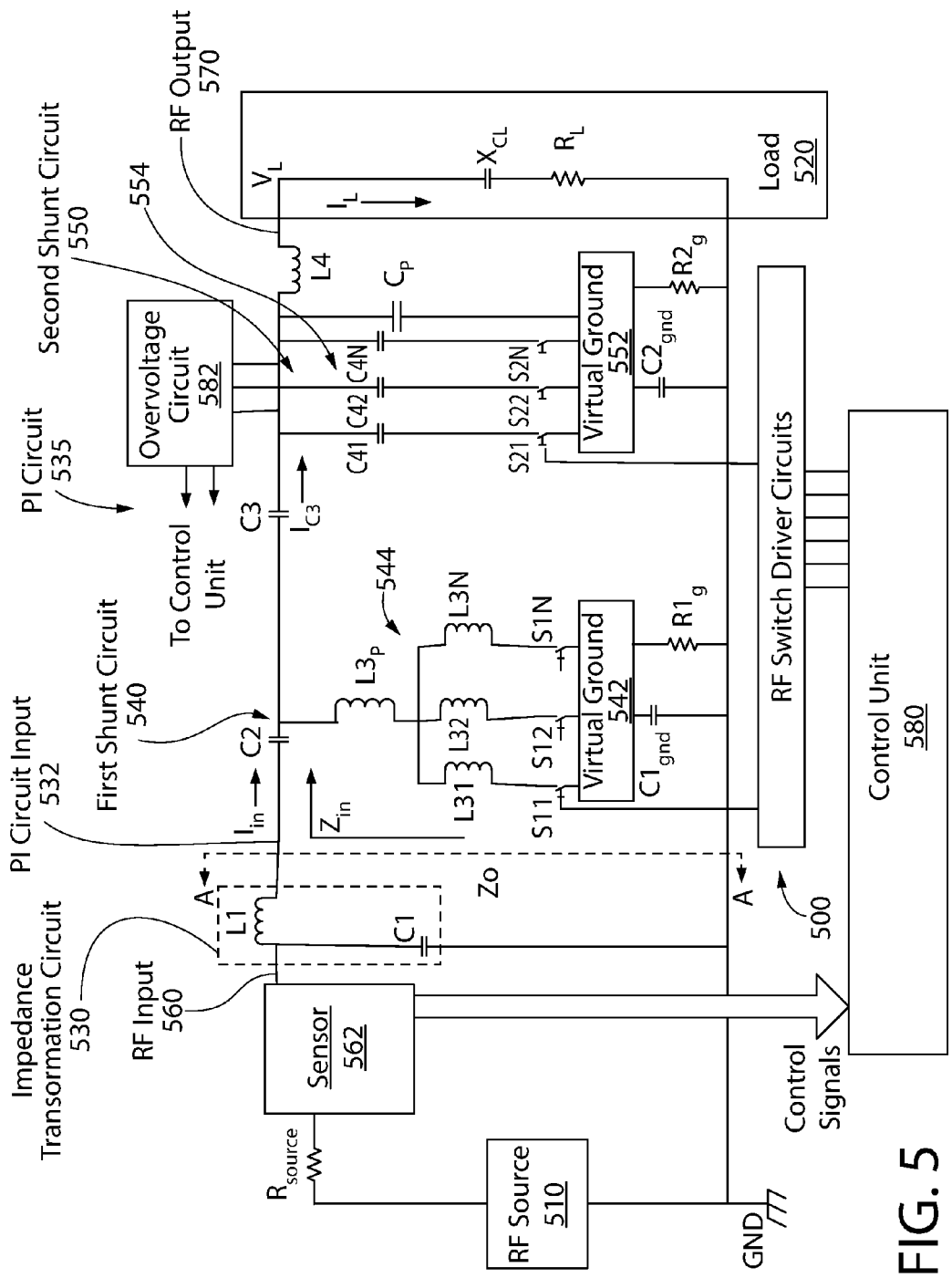
FIG. 5 is a schematic representation of a fifth embodiment of an RF impedance matching network.

FIG. 5 is a schematic representation of a fifth embodiment of an RF impedance matching network 500. This embodiment is similar to the embodiment shown in FIG. 1A, however, the series inductor L2 is replaced with a series capacitor C3, a series inductor L4 is added, and single capacitor C$_{DC}$ in the first shunt circuit 140 of FIG. 1A is eliminated. The embodiment of the matching network 500 shown in FIG. 5 is useful at lower powers up to 5 kW.

Figure 6:
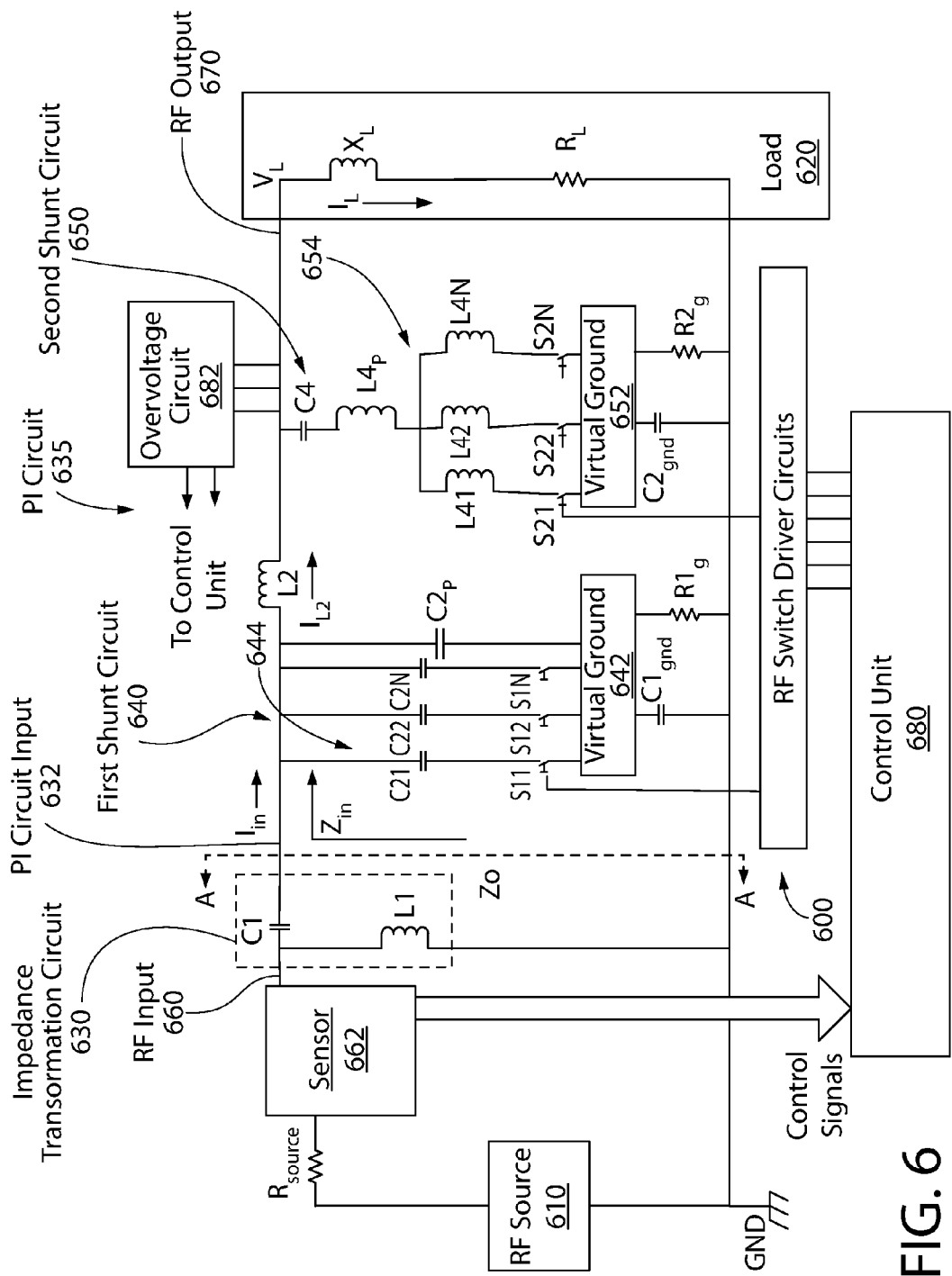
FIG. 6 is a schematic representation of a sixth embodiment of an RF impedance matching network.

FIG. 6 is a schematic representation of a sixth embodiment of an RF impedance matching network 600. This embodiment is similar to the embodiment shown in FIG. 1A, however, the inductor L1 and capacitor C1 of the transformation circuit 630 are reversed, the series capacitor C3 of FIG. 1A is eliminated, and the positioning of the first and second shunt circuit 650s is reversed, such that the first shunt circuit 640 has the plurality of switching capacitors C21, C22, C2N, and the second shunt circuit 650 has the plurality of switching inductors L41, L42, L4N. The embodiment of the matching network 600 shown in FIG. 6 is useful for medium-to-high powers and inductive loads. Since it has only one inductor in the series leg, it can provide good efficiency.

Figure 7:
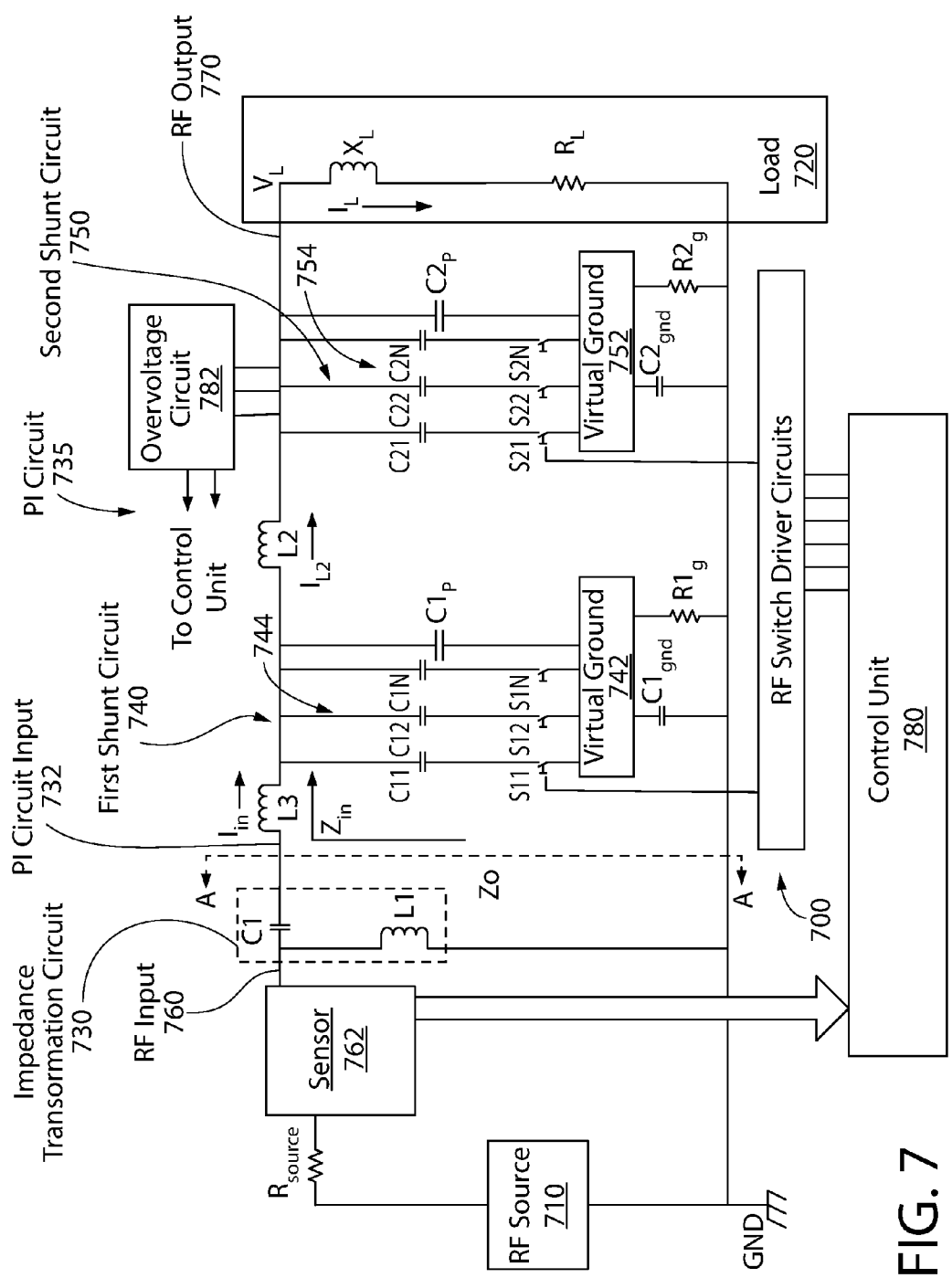
FIG. 7 is a schematic representation of a seventh embodiment of an RF impedance matching network.

FIG. 7 is a schematic representation of a seventh embodiment of an RF impedance matching network 700. This embodiment is similar to the embodiment shown in FIG. 2, however, a series inductor L3 is coupled between the transformation capacitor C1 and the first shunt circuit 740. The embodiment of the matching network 700 shown in FIG. 7 has two inductors in the series leg, and therefore is used for lower powers below 5 kW.

Figure 8:
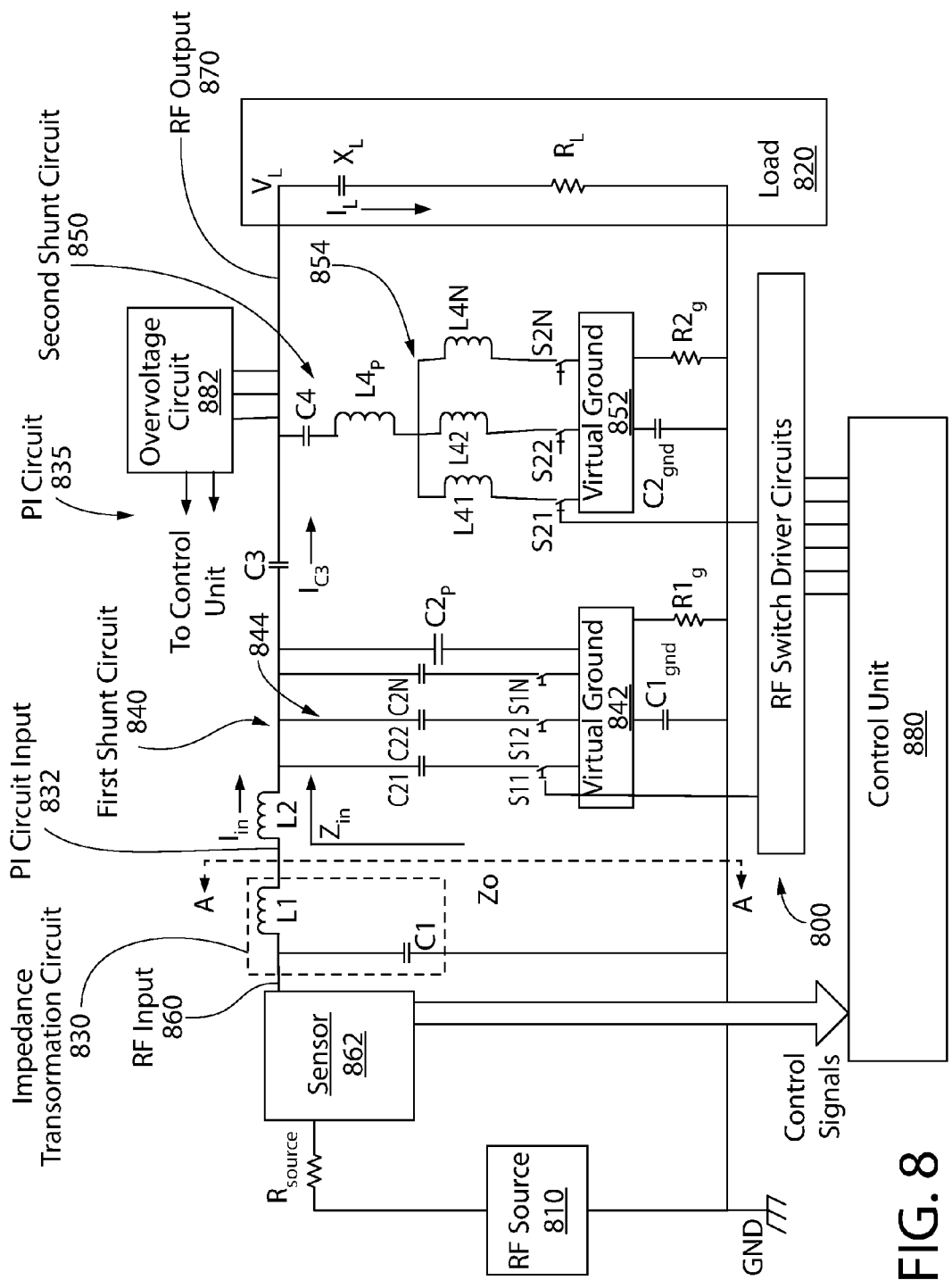
FIG. 8 is a schematic representation of an eighth embodiment of an RF impedance matching network.

FIG. 8 is a schematic representation of an eighth embodiment of an RF impedance matching network 800. This embodiment is similar to the embodiment shown in FIG. 6, however, the inductor L1 and capacitor C1 of the transformation circuit 830 are reversed, a series inductor L2 is added between the transformation inductor L1 and the first shunt circuit 840, and the series inductor L2 between the first and second shunt circuits 840, 850 is replaced with a series capacitor C3. The embodiment of the matching network 800 shown in FIG. 8 is useful for capacitive chamber loads. There are two inductors in the series leg and it is useful for applications below 5 kW.

Figure 9:
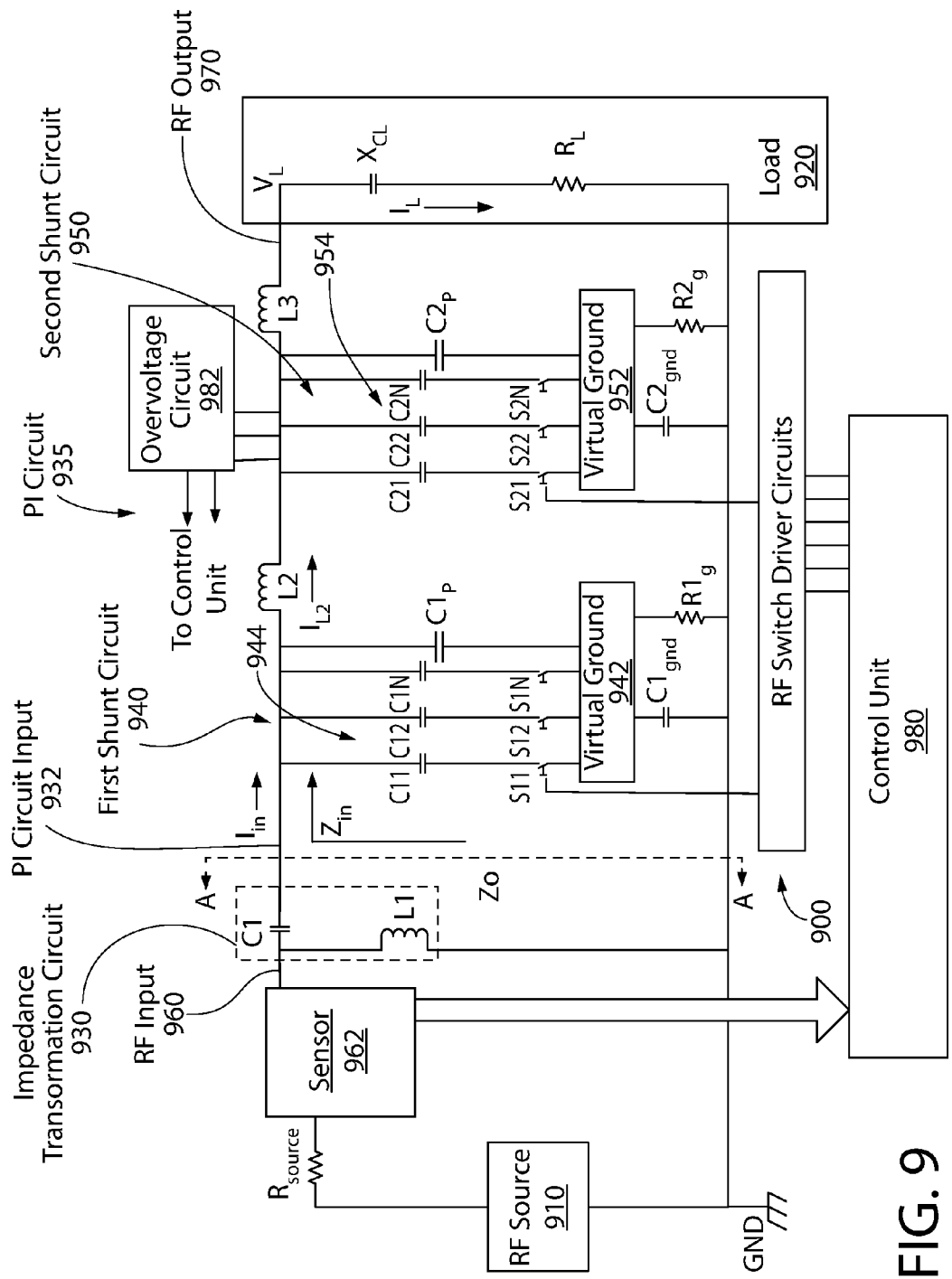
FIG. 9 is a schematic representation of a ninth embodiment of an RF impedance matching network.

FIG. 9 is a schematic representation of a ninth embodiment of an RF impedance matching network 900. This embodiment is similar to the embodiment shown in FIG. 2, however, an additional series inductor L3 is coupled between the second shunt circuit 950 and the RF output 970. The embodiment of the matching network 900 shown in FIG. 9 is useful for capacitive chamber loads. There are two inductors in the series leg and therefore more losses. It is useful for applications below 5 kW.

Figure 10:
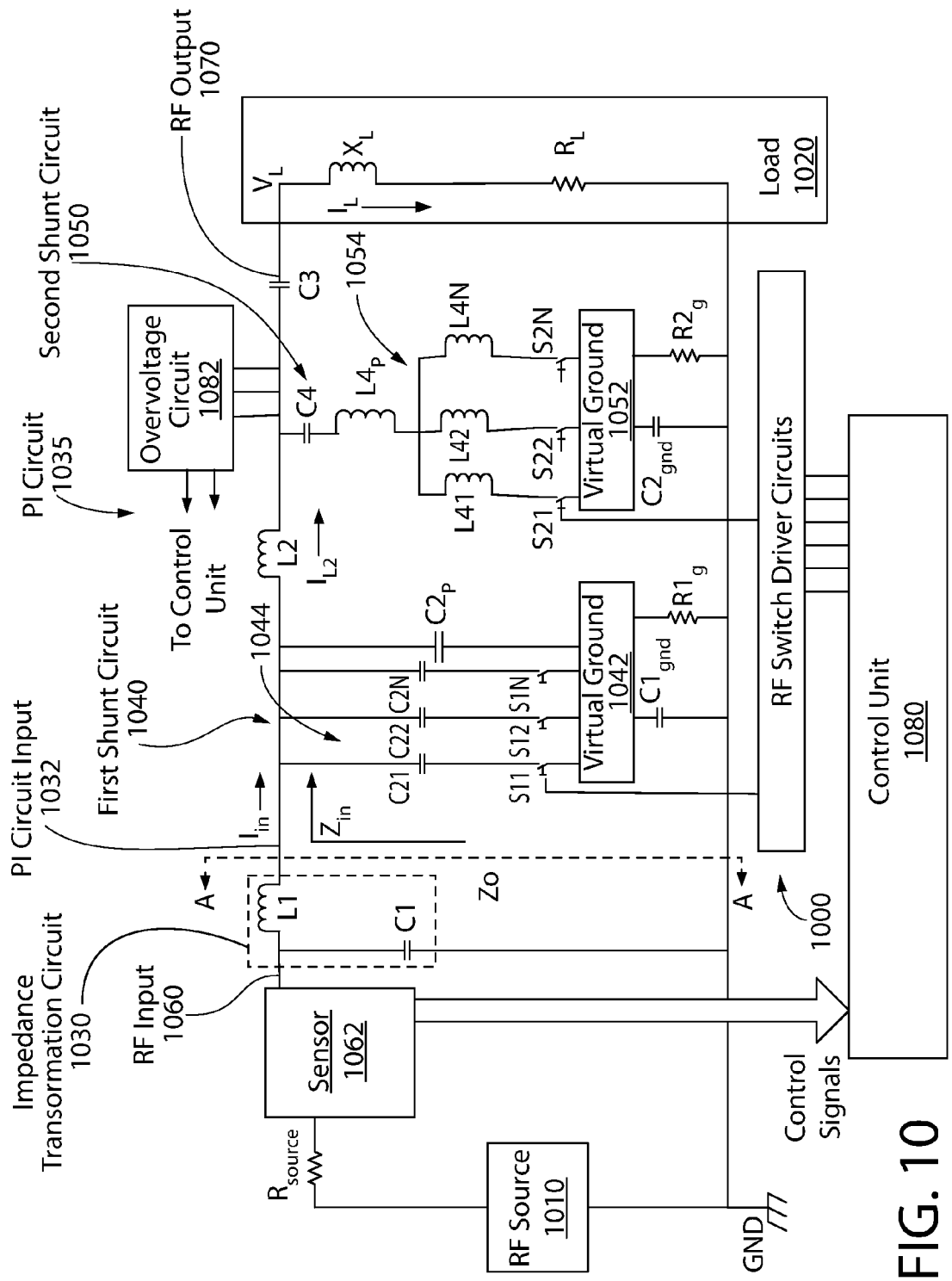
FIG. 10 is a schematic representation of a tenth embodiment of an RF impedance matching network.

FIG. 10 is a schematic representation of a tenth embodiment of an RF impedance matching network 1000. This embodiment is similar to the embodiment shown in FIG. 8, however, the series inductor L3 is coupled between the first shunt circuit 1040 and the second shunt circuit 1050, and the series capacitor C3 is coupled between the second shunt circuit 1050 and the RF output 1070. The embodiment of the matching network 1000 shown in FIG. 10 is useful for inductive chamber loads and for medium-to-low RF power applications. It is noted that, where components in one embodiment are similarly situated to components in another embodiment, the function and characteristics of those components can be similar, though a detailed discussion of those components is not repeated for that particular embodiment.

In Table 1, simulated results for typical matching conditions are shown for the matching network 100 shown in FIG. 1A. The impedance load conditions are assumed as typical chamber impedances. Values for series coupling capacitor C3 (2 nF) and series inductance L2 (8 uH) were specifically chosen to satisfy the circuit equations under the matching conditions. $R_L$ is representative of the real part of the load impedance. $P_{out}$ is the delivered RF power to the load resistor $R_L$. The example components were chosen for delivering 5 kW of RF power to a plasma chamber. The simulations show that the matching network can satisfy all the load impedance conditions for a typical process.

TABLE 1

Matching Network of FIG. 1A Simulation Results.

| $R_L$ Ω | $X_L$ Ω | C3 nF | L31, L32, L3N (var.) uH | L2 (fixed) uH | C21, C22, C2N (var.) pF | $I_{C3}$ A, rms | $I_{L2}$ A, rms | $I_L$ A, rms | $V_L$ kV, rms | $P_{out}$ kW |
|---|---|---|---|---|---|---|---|---|---|---|
| 1 | 31 | 2 | 2.52 | 8 | 3,080 | 9.8 | 15.33 | 66.4 | 1.56 | 5 |
| 2 | 38 | 2 | 3.05 | 8 | 2,640 | 11.3 | 13.3 | 45 | 1.36 | 5 |
| 5 | 39 | 2 | 5 | 8 | 2,400 | 9.9 | 8.03 | 30.5 | 0.812 | 5.8 |
| 10 | 39 | 2 | 5 | 8 | 2,300 | 13.3 | 6.8 | 20 | 0.691 | 5.08 |

Software was used to determine the circuit components values for the variable shunt elements L3, C2 using the assigned load impedance values. The software then calculated the currents and voltages. As is shown, the matching network can be designed with reasonable values for the capacitors and inductors. The simulation was carried out at the frequency f=2 MHz, and therefore the components values reflect that frequency. The assumed power was 5 kW. One could choose other value for the variable shunt elements L3, C2 to attempt to have even smaller currents and voltages in the variable shunt elements L3, C2.

Switching Circuits

FIGS. 11-15 below discuss switching circuits that can be utilized in the above matching networks. For example, each of switches S11 to S1N and S21 to S2N in FIG. 2 can utilize one of the switching circuits discussed below to switch capacitors C11 to C1N and C21 to C2N, respectively, thus enabling electronically variable capacitance. Similarly, the switching circuits can switch the inductors L31 to L3N of FIG. 1 to enable variable inductance. Accordingly, switches S11 to S19 of FIG. 1B can utilize one of the switching circuits discussed below.

The switching circuits discussed below can also be used outside of RF matching networks, and outside the realm of high frequency switching. For example, certain switching circuits may be used as a form of high voltage relay at a low frequency. The disclosed switching circuits can also be used in equipment such as magnetic resonance circuits, medical equipment circuits (e.g., ultrasound imaging or x-ray equipment). Another possible application is in telecommunications equipment where the antenna impedance should be matched to the transmitter output impedance. In such cases as transmitters, there are many applications where the carrier frequency is switched under so-called hot switching conditions. These switches are also used in handheld transmitters for military use, and in many other military applications using various transmitters and receivers.

Figure 11:
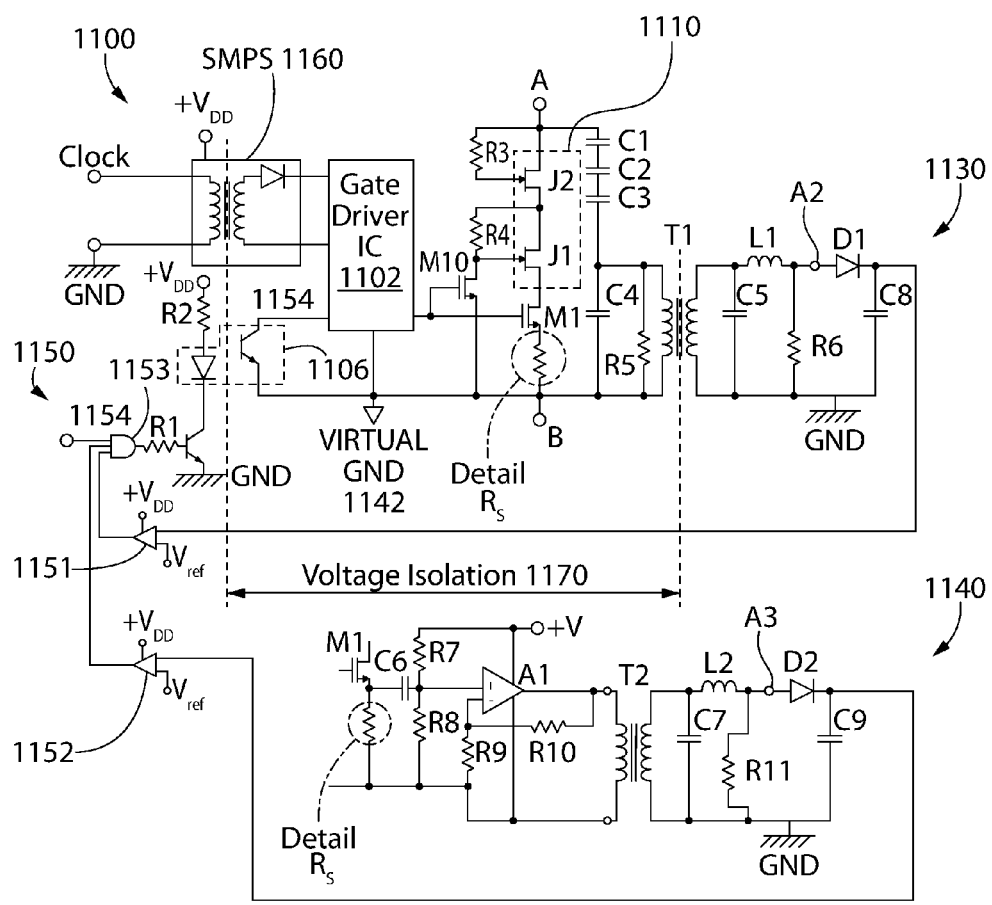
FIG. 11 is a schematic representation of a first switching circuit.

Referring now to FIG. 11, a first switching circuit 1100 is shown. The first switching circuit 1100 comprises a passive switch 1110 coupled to a first switch terminal A. The first switching circuit 1100 further comprises a driving switch M1 coupled in series with the passive switch 1110 and a second switch terminal B, the driving switch M1 configured to turn the passive 1110 switch on and off. The first switching circuit 1100 further comprises a power source 1160 configured to provide power to the passive switch 1110 and the driving switch M1. The first switching circuit 1100 further comprises a monitoring circuit 1150 configured to (1) receive an indication that a switching circuit voltage exceeds a predetermined amount and, in response, reduce the power provided to the driving switch M1; and (2) receive an indication that a switching circuit current exceeds a predetermined amount and, in response, reduce the power provided to the driving switch M1. In other embodiments, the monitoring circuit 1150 can be configured to perform operation (1) and not operation (2), or operation (2) and not operation (1). These components and operation will be described further below.

In the exemplified embodiment, the power source 1160 is a switched mode power supply (SMPS). Further, the exemplified switching circuit includes a gate driver 1102 operably coupled to (a) the power source 1160, (b) a gate of the passive switch 1110, and (c) a gate of the driving switch M1. In other embodiments, other power sources, drivers, and/or amplifiers can be used as required by the components of the specific switching circuit.

In the exemplified embodiment, the passive switch 1110 comprises a plurality of switches connected in series. Specifically, the passive switch 1110 comprises two high voltage and high current junction gate field-effect transistors (JFETs) J1, J2. In other embodiments, the passive switch can comprise any number of switches, and those switches can be of various types. The exemplified JFETs of the passive switch 1110 are connected in series to increase the voltage operation of the switching circuit 1100.

The first switching circuit 1100 further comprises a driving switch M1 coupled in series with the passive switch 1110 and a second switch terminal B. The driving switch M1 can be configured to turn the passive switch 1110 on and off. In the exemplified embodiment, the driving switch M1 comprises a high voltage and high current metal-oxide-semiconductor field-effect transistor (MOSFET). In other embodiments, other switches can be used, such as a BJT, an IGBT, and even a relay (e.g., in special applications at low frequency and high currents). Connecting the driving switch M1 and passive switch 1110 in series allows the circuit to use an industry standard gate driver integrated circuit (IC) with the driving switch M1.

The switching circuit 1100 can be configured such that JFETS J1, J2 are always turned on, and thereby the JFETS J1, J2 can provide high voltage isolation 1170. Resistors R3 and R4 (which can have large values, e.g., 10 Megaohms) can connect the gate and drain of the JFETs J1, J2 to the same potential and can force the JFETS to the on condition. The drain voltages starting on terminal A in FIG. 11 can distribute equally on all three transistors M1, J1, J2. In other embodiments, the switching circuit can include more than two JFETS in series, but the packaging of these devices must be such that the high voltage would not break down on the junctions. A separate circuit that allows equal voltage distribution on the switches is omitted here, as such circuits (e.g., a snubber circuit) are well known. These switches are typically heat sunk either on an air heat sink or water-cooled heat sink.

The first switching circuit 1100 can also include an optocoupler 1106 configured to electrically isolate the gate driver IC 1102 from the monitoring circuit 1150 (discussed below). The optocoupler 1106 can drive the gate driver IC 1102 on and off, thus also driving the first switching circuit 1100 on and off. Supply line +V can be around 10-15 VDC and can be supplied by a switched-mode power supply (SMPS). DC isolation on the SMPS is expected to be greater than 4 kV for this application, thus enabling the switching circuit 1100 to be used in a high voltage RF application. In the exemplified embodiment, the low voltage monitoring circuit 1150 is isolated from the drains and high voltage switching voltage by at least 4 kV peak, if not more in other applications. For higher power applications on this switching circuit, the voltage separation can be raised even higher. The gate driver can have the floating SMPS associated with it for that purpose.

The exemplified optocoupler 1106 and gate driver IC 1102 are not connected to chassis ground GND but to a virtual ground. The main RF ground (terminal B) is connected to the virtual ground. The virtual ground can be designed similarly to the virtual ground shown in FIG. 1B, which is an aluminum plate with embedded tubes for water cooling. Mounted on the virtual ground can be variable capacitors or inductors and a switching circuit for each. Thus, components of the switching circuit 1100 (e.g., power FETs) can be mounted on the virtual ground. As discussed above, the virtual ground can be connected via a series network directly to the chassis ground.

The exemplified virtual ground is floating, and it has an isolation of the systems grounds as large as the transformers and the optocouplers will allow. For that reason, two or more such system switches can be connected in parallel to increase the current switching capabilities.

The first switching circuit 1100 can be considered "smart" or "self-healing" as it has two automatic shut-off conditions—one for excessive voltage and one for excessive current. Regarding excessive voltage, in the exemplified embodiment, the switching circuit 1100 can be switched off if a voltage on terminal A exceeds a predetermined value. For example, the predetermined value can be 4,000 V.

An excessive voltage indication can be provided by a voltage sensing circuit 1130, the voltage sensing circuit 1130 comprising (a) a first transformer T1 operably coupled to the second terminal B and (b) a first diode D1 operably coupled to the monitoring circuit 1150. The switching circuit 1100 can be designed such that, if the voltage at terminal A is 4,000 V, then the voltage at diode D1 output (voltage sensing circuit output) is 4 VDC. The voltage at the diode D1 output can provide evidence of excessive voltage at terminal A or elsewhere in the circuit.

Diode D1 and the optocoupler 1106 can be connected to a monitoring circuit 1150 for monitoring the switching circuit 1100 for excessive voltage or current. In the exemplified embodiment, the monitoring circuit 1150 can be configured to (1) receive an indication that a switching circuit voltage exceeds a predetermined amount (excessive voltage indication) and, in response, reduce the power provided to the driving switch M1; and (2) receive an indication that a switching circuit current exceeds a predetermined amount (excessive current indication) and, in response, reduce the power provided to the driving switch M1.

The monitoring circuit 1150 can include low-level logic components to determine whether a shut-off condition is present. For example, regarding excessive voltage, a first comparator 1151 can be used to receive the excessive voltage indication. The first comparator 1151 can receive a threshold voltage $V_{ref}$ on a first terminal and can be set to normally provide an output a logical value "1" (e.g., +4 V). The first comparator 1151 can also receive a signal from the voltage sensing circuit 1130. When the voltage at the voltage sensing circuit output (the monitor voltage) exceeds the $V_{ref}$, the comparator can change its condition to logical "0" (e.g., 0 V), thus causing the shut off condition on gate 1153 for the control signal 1154.

The second shut off condition of the switching circuit 1100 can be based on current. The switching circuit 1100 can include a current sensing circuit 1140. The current sensing circuit 1140 can determine a current passing from a first switch terminal A to a second switch terminal B of the first switching circuit when the switching circuit is turned on by the control signal 1154. That current can be determined by the RF impedance load that the first switching circuit 1100 is switching on and off. This current is similar to load current $I_L$ in FIGS. 1A and 3-10. The current sensing circuit 1140 can include (a) a second transformer T2 operably coupled to the second terminal B and (b) a second diode D2 operably coupled to the monitoring circuit 1150. The current sensing circuit 1140 can further include sense resistor $R_S$. Sense resistor $R_S$ is shown adjacent to terminal B in FIG. 11, and its surrounding components are shown in more detail below as part of sensing circuit 1140. Sense resistor $R_S$ can provide a low resistance (e.g., 10-50 mOhms). The circuitry that follows the sense resistor $R_S$ can function like a high-speed operational amplifier with sufficient gain bandwidth product to replicate the RF current waveform. The gain in the operational amplifier chain must be such that the switching circuit 1100 can detect an appreciable RF voltage. In some cases, such as at lower frequencies and high currents, the switching circuit 1100 can use a current transformer in the source of driving switch M1 instead of a sense resistor. If the inductance of the current transformer is sufficiently small at the frequency of operation, it can be substituted for the $R_S$ sense resistor.

The current in the source of the driving switch M1 can thus be detected and received via the source resistor $R_S$. The processing of the current waveform is received by the source resistor $R_S$ and the operational amplifier circuitry that follows the detected waveform. The signature of the current in the source of the driving switch M1 can be used to see its amplitude. This current amplitude is detected and can be viewed on an oscilloscope to determine the shape and the frequency spectrum, if necessary. Further on, after the output of the operational amplifier A1, there is diode D2. The output of that diode D2 (used as a detector) is a DC voltage proportional to the RMS value of the source current in the driving switch M1. This detected DC voltage waveform can be sent to the second comparator 1152, with a reference voltage $V_{ref}$ on the other terminal of the second comparator 1152. When the detected voltage, which is now proportional to the current in the source of the driving switch M1, is larger than a predetermined value, this can be considered an excessive current indication. In this case, the reference voltage can trip the second comparator 1152 output from its normally high value (logic value "1") to a low value (logic value "0"). The monitoring circuit 1150 can thus detect that the current in the driving switch M1 has exceeded the predetermined value.

The monitoring circuit 1150 can include an AND logic gate 1153 to switch off the gate driver IC 1102 when a shut off condition has occurred. In the exemplified embodiment, a three-input wide AND logic gate 1153 is utilized. The detector diodes D1, D2, as described above, rectify the RF waveforms of detected RF voltage and current and covert them to DC so that the signals can be used at the comparator terminals. The comparators 1151, 1152 receive signals from the detector diodes D1, D2. The comparer outputs can be logic signals that are received by the AND logic gate 1153. The AND logic gate 1153 can shut off the incoming control signal 1154 if a high voltage or high current condition is indicated. In the exemplified embodiment, when a high voltage condition is indicated the first comparator output is a logic value 0, and when a high voltage condition is indicated the second comparator output is a logic value 0. If the AND logic gate 1153 receives a logic value 0 from either comparator 1151, 1152, the AND logic gate 1153 can shut down the control signal 1154 and thereby switch off the gate driver IC 1102. In so doing, the monitoring circuit 1150 can ensure safe voltage and current operation values. The set of safe operating values can be set by the appropriate reference voltage values on the comparators 1151 and 1152.

The foregoing circuitry can further signal an LED light to tell an operator that the switching circuit 1100 has exceeded the prescribed voltage or current value. The LED light can stay on as long as there is an excessive voltage or current condition. In other embodiments, the switching circuit 1100 can utilize methods other than those described above for responding to excessive voltage or excessive current conditions on the passive switch 1110 and the driving switch M1.

There are several advantages to the described self-healing switch. Other solutions for shutting off such switches could include the use of control board algorithms. But such an approach is usually too slow to shut off the driving switch M1 off when the voltage becomes excessive. The exemplified analog hardware implementation is much faster. The voltage sensing circuit 1130 is designed such that its frequency bandwidth can be large enough to cover at least the third harmonic of the RF frequency that is being switched. For example, if the switching circuit 1100 is used in the standard ISM frequency of 13.56 MHz, the bandwidth of the voltage sensing circuit 1130 can be larger than 40.68 MHz. This large frequency bandwidth also enables one to see the shape of the switched waveform during the switching conditions. That shape can be observed at terminal A2 before the detector diode D1.

The exemplified switching circuit 1100 can prevent a catastrophic switch failure in the case of high voltage transient returning back from the vacuum chamber via the matching network and on the RF switches. In high VSWR ratios, that condition could occur, for example, when setting up the process recipe in the process chamber and other anomalies in the chamber.

The switching circuit 1100 can further include an intermediary switch M10 for enabling the passive switch 1110 to switch simultaneously with the driving switch M1. In the exemplified embodiment, the intermediary switch M10 is a MOSFET, though in other embodiments other switches can be used. In the exemplified embodiment, the intermediary switch M10 can allow the switching circuit 1100 to disconnect the gate of switch J1 when switch M1 is in the OFF condition. This allows slightly larger high voltage potentials on terminal A.

The exemplified intermediary switch M10 comprises a gate, a drain, and a source. The gate is operably coupled to the power source 1160. In this embodiment, the gate of the intermediary switch M10 is connected to output of the gate driver 1102, though other designs can be used. Further, the drain of the intermediary switch M10 is operably coupled to the passive switch 1110. In the exemplified embodiment, the drain of the intermediary switch M10 is connected to the gate of switch J1.

If the intermediary switch M10 were not in the gate of switch J1, the gate of switch J1 would be connected to the virtual ground or a bottom terminal B. The maximum voltage on the drain of the driving switch M1 would be low in all situations. The drain of driving switch M1 would only see the $V_{GS}$ (gate-source voltage) voltage drop of switch J1. In this case, all the voltage drops from terminal A down to terminal B would be across the passive switch 1110—in the exemplified embodiment, switches J1, J2. Since the driving switch M1 is used only as a switching device at relatively low voltages, the driving switch M1 would likely be an inexpensive and high speed device.

But in the exemplified embodiment, due to the intermediary switch M10, the gate of driving switch M1 and the gate of switch M10 can be switched simultaneously. As a result, the off condition of the series connected driving and passive switches M1, 1110 (e.g., vertically cascoded switches M1, J1, J2) behave differently. Specifically, the high voltage from terminal A down to terminal B can be distributed more evenly. Instead of two transistors taking all the high voltage distribution, there can be three transistors distributing the high voltage—in the exemplified embodiment, switches J1, J2 and M1—since the gate of J1 is opened with the switching action of intermediary switch M10.

In this example, switch M1 should have a high voltage rating similar to those of switches J1, J2. If the gate of switch J1 would be connected directly to ground, the switching circuit could use switch M1 at a relatively low drain voltage. For lower switching voltages, such a configuration could be used. Switch M10 can be a low drain current device with a high drain voltage breakdown that does not have to be heat sunk.

The switching circuit 1100 can further include voltage sense capacitors C1, C2, C3 and C4. A typical design of such a high voltage probe is in the ratio of 1000:1. The capacitors C1, C2, C3 can therefore be in the order of 10 pF and at very high break down voltage. Capacitor C4 can be adjusted accordingly to read 1000:1 in voltage ratio.

Resistors R3, R4 can be included to keep the switches J1, J2 on. Further, these resistors R3, R4 can have very high values (e.g., 10 Mega Ohms or more), and thus can prevent excessive bleed off of RF current in the off condition.

In the exemplified embodiment, transformers T1, T2 can be pulse transformers with a winding isolation in the order of greater than 4 kV. These transformers T1, T2 can detect small voltages in the order of few millivolts to a few volts. Both can be used as detector transformers. They can be very small in size but, since they are pulse transformers, they must have very large frequency bandwidth response. The bandwidth is typically determined so that the switching circuit 1100 can detect up to the fifth harmonic of the RF signal being switched. For instance, if the switching circuit was to switch a high voltage and high current waveform at a fundamental frequency of 10 MHz, the detecting transformers T1, T2 can have their bandwidths up to 50 MHz to clearly replicate the drain voltage after capacitive dividers C1, C2, C3 and C4 for the drain voltage and the current transformer T2 that will replicate the source current in switch M1.

Figure 12:
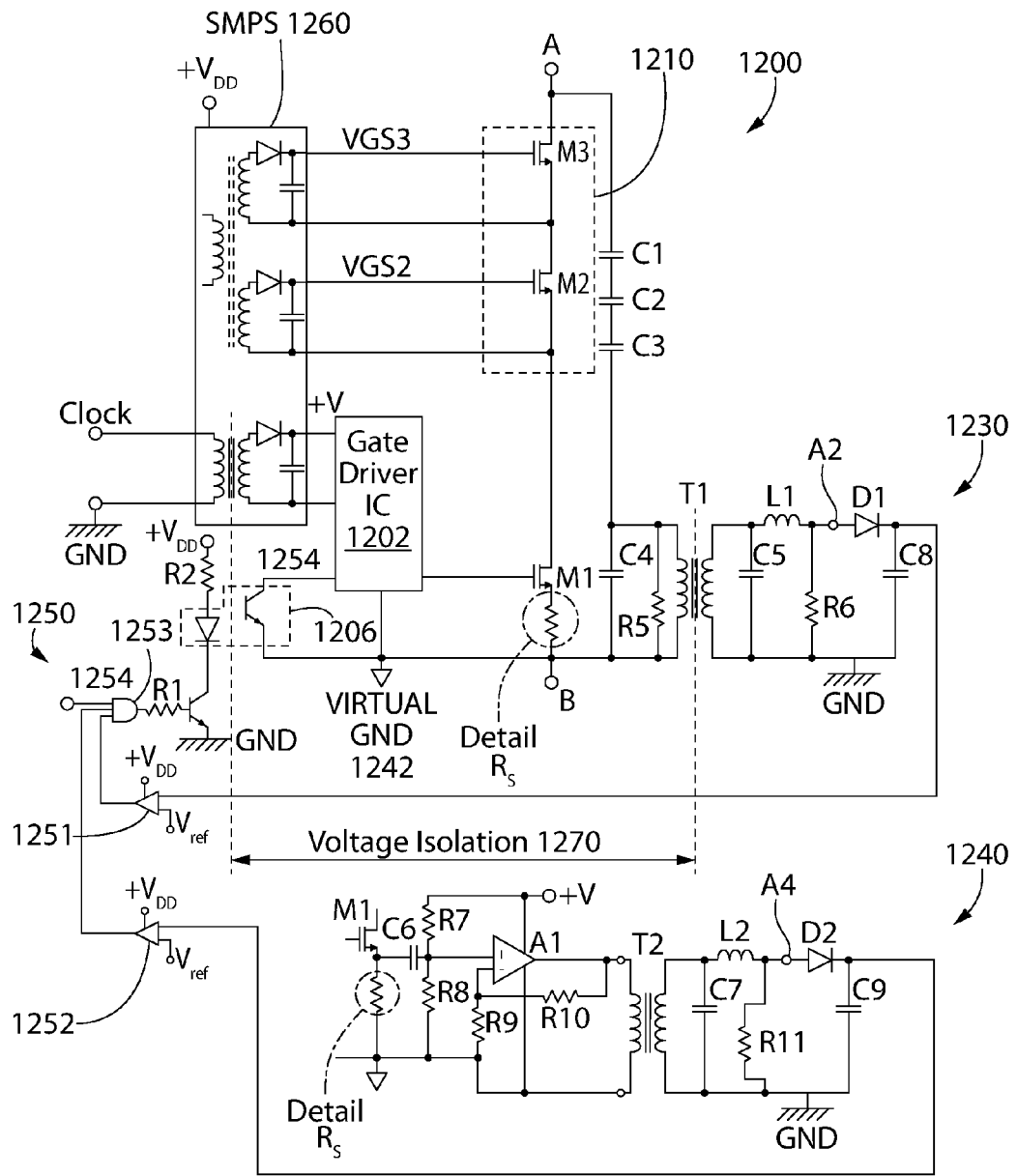
FIG. 12 is a schematic representation of a second switching circuit.

FIG. 12 provides a schematic of a second switching circuit 1200. The second switching circuit 1200 is very similar to the first switching circuit 1100 of FIG. 11, and therefore most of the discussion with regard to FIG. 11 applies to also to FIG. 12. Accordingly, comparable components are shown, including gate driver 1202, optocoupler 1206, driving switch M1, voltage sensing circuit 1230, current sensing circuit 1240, monitoring circuit 1250, first comparator 1251, second comparator 1252, AND logic gate 1253, control signal 1254, and power source 1260. Voltage isolation 1270 is also shown.

The primary difference from first switching circuit 1100 is that the second switching circuit 1200 uses MOSFETs M1, M2, M3 in series, instead of a combination of MOSFETs M1 and JFETs J1, J2. Thus the passive switch 1210 uses MOSFETs M2, M3 instead of switches J1, J2. The MOSFETs M1, M2, M3 in the shown vertical position will typically have smaller inter-electrode capacitance. In particular, the MOSFET M3 will typically have a smaller capacitance between the drain and gate and the drain to source than a JFET for the same current. Since the capacitance will be smaller, the second switching circuit 1200 can operate at slightly higher frequencies. The MOSFETs M2, M3 must be kept on (as with switches JFETS J1, J2), but each MOSFET has its own floating DC voltage to keep it in the on condition. Those floating gate-source voltages $V_{GS2}$, $V_{GS3}$ for M2 and M3 are provided by the power supply 1260. To provide the necessary floating voltages for MOSFETs M1, M2, and M3, the power supply 1260 (an SMPS) is designed to have three separate secondary windings from which to make three isolated DC voltages—$V_{GS1}$ (the gate-source voltage of M1), $V_{GS2}$ (the gate-source voltage of M2), and $V_{GS3}$ (the gate-source voltage of M3). The MOSFET M1 is the master switch to turn on and off the whole vertical chain of MOSFETs M1, M2 and M3. In both the first switching circuit 1100 and the second switching circuit 1200, the clock input terminal to the power supply SMPS 1260 can be from 100 kHz to 1 MHz in switch mode supplies. The power supply SMPS also can use the external DC voltage $+V_{DD}$ from an external DC supply. In one embodiment, the external DC voltage can be in the order of +15 VDC. This DC supply can be used in the first switching circuit 1100 and the second switching circuit 1200.

Figure 13:
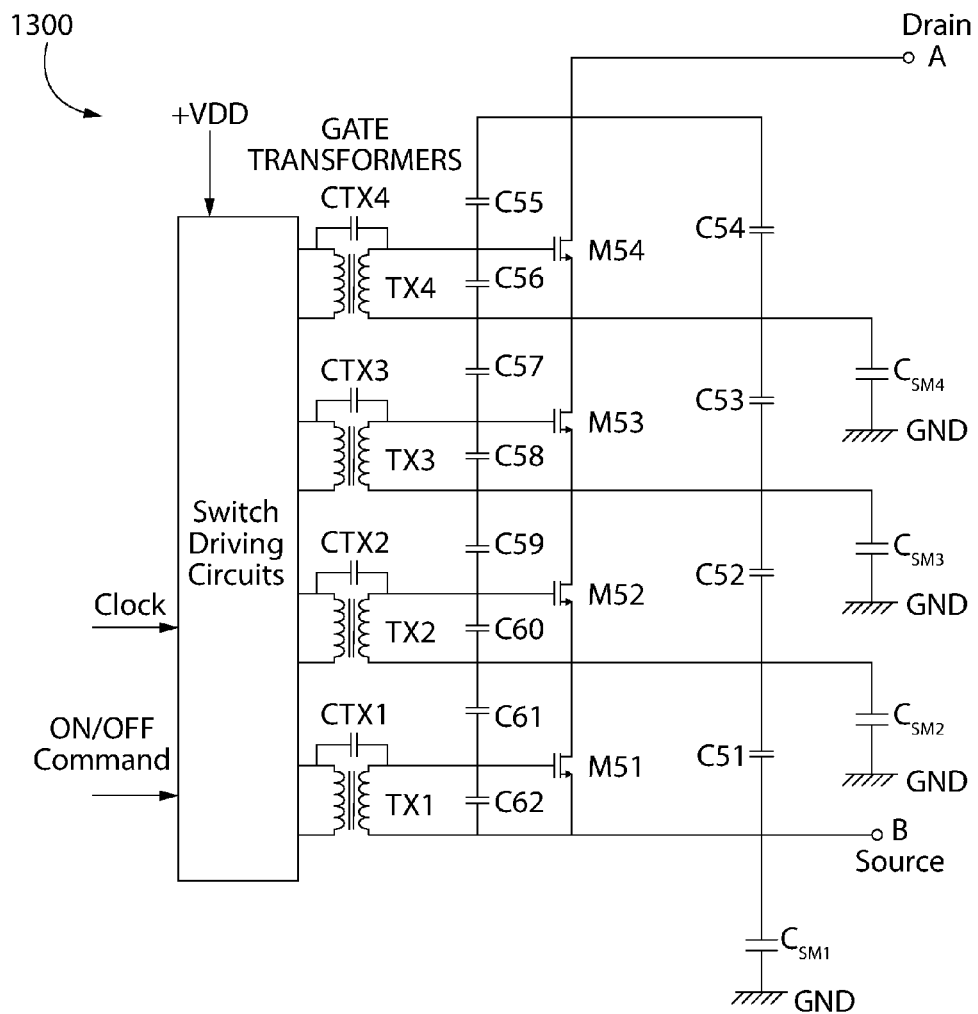
FIG. 13 illustrates parasitic capacitances on a switching circuit.

FIG. 13 illustrates parasitic capacitances on a switching circuit 1300. The switching circuit 1300 includes four MOSFET M51, M52, M53, M54 connected vertically in series. In other embodiments, other switches can be used. Switch terminals D and S are floating. First parasitic capacitances C51-C62 are on each of the MOSFETs. Second parasitic capacitances $C_{SM1}$-$C_{SM4}$ are from the back body of the MOSFETs to the mounting on the heat sink ground GND. Also shown is coupling parasitic capacitances $C_{TX1}$-$C_{TX4}$ on the gate driver transformers. The parasitic capacitances present possible frequency limitations, and therefore it can be advantageous to keep the parasitic capacitances as low as practically possible. When designing switching circuits, it can be helpful to first predict the parasitic capacitances and from them calculate the maximum frequency of operation for the switching circuit.

Figure 14:
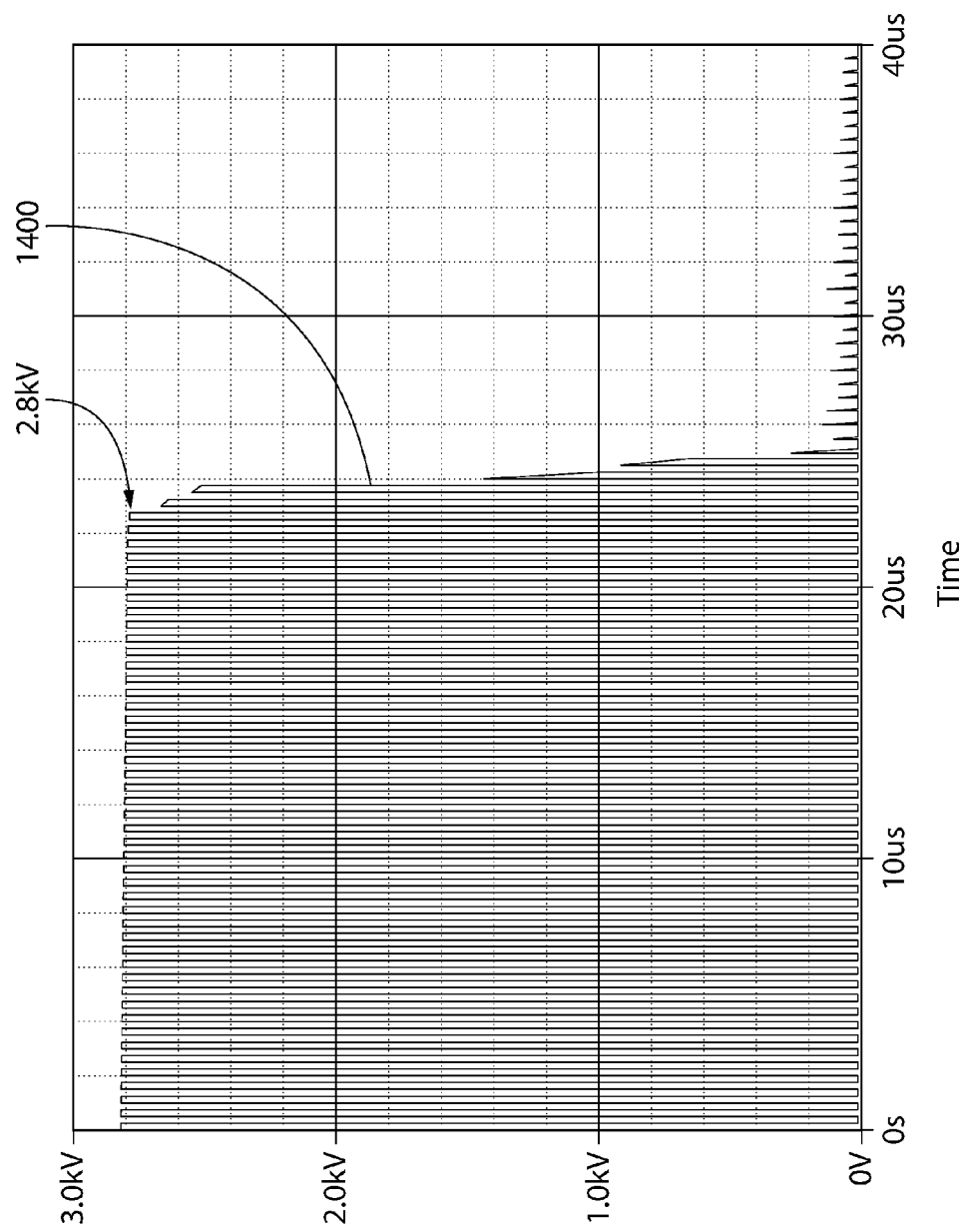
FIG. 14 is a graph of a switched waveform.

FIG. 14 is a graph of a switched waveform 1400. The waveform 1400 is an example waveform for one embodiment of the switching circuit. The frequency is 2 MHz. The RF voltage switched is 3000 V peak to peak. The switching off time is approximately 2 μs. Note the that the switch does not swing the full 3000 V due to inherited capacitance in the circuit. Such computer analysis of switching performance can be performed using P-spice or similar software.

Figure 15:
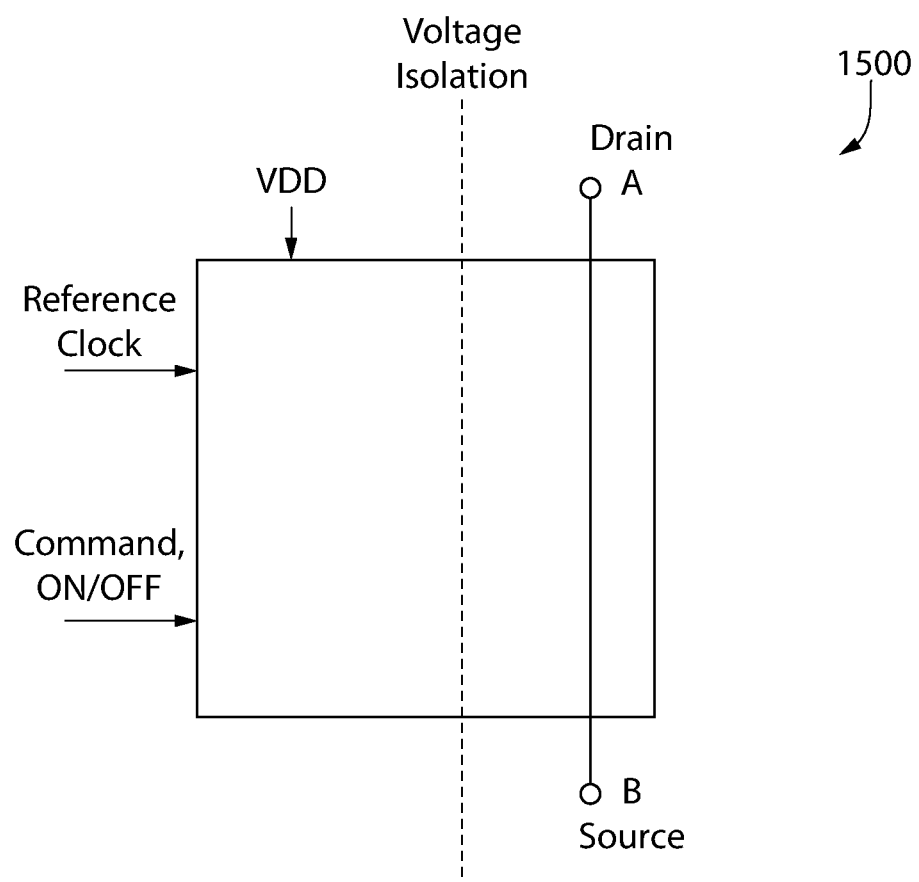
FIG. 15 is a block diagram of a switching circuit.

FIG. 15 is a simplified block diagram that provides a basic model for the switching circuits described above. The switching circuit 1500 includes terminals A and B. The outputs are floating. High power voltage and current terminals are electrically isolated from the logic driven switching conditions. Since the terminals A and B are floating, such switches can be connected in parallel to increase the current capability. Such switches can also be connected in series to achieve even higher voltages. In one example, the switch can provide a high voltage isolation 1170 of more than 5 kV.

For the circuits discussed above, note that not all components are shown. Rather, the drawings show those components helpful in conveying an understanding of the circuit and its operation. A person of ordinary skill in the art will readily understand the role other standard components can play in the circuit.

There are several advantages to the switching circuits discussed above. First, the switching circuits eliminate disadvantages associated with PIN diodes. PIN diodes require elaborate RF choke designs to support the off condition and DC forward current for turning the PIN diode on. The PIN diodes also require a high DC voltage to back bias the PIN diode to off. Further, the disclosed switching circuits can be simpler to implement. Further, the disclosed switching circuit designs allow for the addition of further switches (e.g., more FETs) to handle even higher voltages when such switches are connected in series. Further, more switches can be connected in parallel to allow for higher current capability of the switch.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A switching circuit comprising:
   a passive switch coupled to a first switch terminal;
   a driving switch coupled in series with the passive switch and a second switch terminal, the driving switch configured to turn the passive switch on and off;
   a power source configured to provide power to the passive switch and the driving switch; and
   a monitoring circuit configured to:
      receive an indication that a switching circuit voltage exceeds a predetermined amount and, in response, reduce the power provided to the driving switch; or
      receive an indication that a switching circuit current exceeds a predetermined amount and, in response, reduce the power provided to the driving switch.

2. The switching circuit of claim 1 wherein the switching circuit current is a current passing from the first switch terminal to the second switch terminal.

3. The switching circuit of claim 1 wherein the switching circuit voltage is a voltage at a first switch terminal.

4. The switching circuit of claim 1 wherein the driving switch comprises a MOSFET.

5. The switching circuit of claim 1 wherein the passive switch comprises a plurality of switches connected in series.

6. The switching circuit of claim 1 wherein the passive switch comprises a first JFET and a second JFET connected in series.

7. The switching circuit of claim 1 wherein the passive switch comprises a first MOSFET and a second MOSFET connected in series.

8. The switching circuit of claim 1 wherein an intermediary switch coupled to the passive switch enables the passive switch to switch simultaneously with the driving switch.

9. The switching circuit of claim 8 wherein the intermediary switch comprises a gate, a drain, and a source, the gate operably coupled to the power source, and the drain operably coupled to the passive switch.

10. The switching circuit of claim 1 wherein the monitoring circuit is configured to:
  receive an indication that a switching circuit voltage exceeds a predetermined amount and, in response, reduce the power provided to the driving switch; and
  receive an indication that a switching circuit current exceeds a predetermined amount and, in response, reduce the power provided to the driving switch.

11. The switching circuit of claim 10 wherein:
  the indication that the switching circuit voltage has exceeded a predetermined amount is received by a first comparator; and
  the indication that the switching circuit current has exceeded a predetermined amount is received by a second comparator.

12. The switching circuit of claim 10 wherein:
  the indication that the switching circuit voltage has exceeded a predetermined amount is provided by a voltage sensing circuit, the voltage sensing circuit comprising (a) a first transformer operably coupled to the second terminal and (b) a first diode operably coupled to the monitoring circuit; and
  the indication that the switching circuit current has exceeded a predetermined amount is provided by a current sensing circuit, the current sensing circuit comprising (a) a second transformer operably coupled to the second terminal and (b) a second diode operably coupled to the monitoring circuit.

13. The switching circuit of claim 1 wherein the power source comprises a switched mode power supply.

14. The switching circuit of claim 13 further comprising a gate driver operably coupled to the switched mode power supply, a gate of the passive switch, and a gate of the driving switch.

15. An RF impedance matching network comprising:
  an RF input configured to couple to an RF source, the RF source having a fixed RF source impedance;
  an RF output configured to couple to a load, the load having a variable load impedance;
  a first circuit comprising a first variable component providing a first variable capacitance or inductance; and
  a second circuit comprising a second variable component providing a second variable capacitance or inductance;
  wherein each of the first circuit and the second circuit comprise a plurality of switching circuits configured to provide the first variable capacitance or inductance and the second variable capacitance or inductance, respectively, each of the plurality of switching circuits comprising:
    a passive switch coupled to a first switch terminal;
    a driving switch coupled in series with the passive switch and a second switch terminal, the driving switch configured to turn the passive switch on and off; and
    a power source configured to provide power to the passive switch and the driving switch.

16. The RF impedance matching network of claim 15 further comprising a monitoring circuit configured to:
  receive an indication that a switching circuit voltage exceeds a predetermined amount and, in response, reduce the power provided to the driving switch; or
  receive an indication that a switching circuit current exceeds a predetermined amount and, in response, reduce the power provided to the driving switch.

17. A method of controlling a switching circuit, the method comprising:
  providing a switching circuit comprising:
    a passive switch coupled to a first switch terminal;
    a driving switch coupled in series with the passive switch and a second switch terminal, the driving switch configured to turn the passive switch on and off;
    a power source configured to provide power to the passive switch and the driving switch; and
    a monitoring circuit;
  receiving at the monitoring circuit (a) an indication that a switching circuit voltage exceeds a predetermined amount or (b) an indication that a switching circuit current exceeds a predetermined amount; and
  reducing the power provided to the driving switch in response to the receipt of indication (a) or (b), the reduction of power switching off the switching circuit.

18. The method of claim 15 wherein the monitoring circuit is configured to:
  receive an indication that a switching circuit voltage exceeds a predetermined amount and, in response, reduce the power provided to the driving switch; and
  receive an indication that a switching circuit current exceeds a predetermined amount and, in response, reduce the power provided to the driving switch.

19. The method of claim 17 wherein an intermediary switch coupled to the passive switch enables the passive switch to switch simultaneously with the driving switch.

20. The method of claim 19 wherein the intermediary switch comprises a gate, a drain, and a source, the gate operably coupled to the power source, and the drain operably coupled to the passive switch.

* * * * *